(12) United States Patent  
Eaton, Jr.

(10) Patent No.: US 9,246,035 B2
(45) Date of Patent: Jan. 26, 2016

(54) PORTABLE SOLAR PANEL POWER SOURCE

(71) Applicant: Day and Night Solar, LLC, Collinsville, IL (US)

(72) Inventor: Robert G Eaton, Jr., Edwardsville, IL (US)

(73) Assignee: DAY AND NIGHT SOLAR, LLC, Collinsville, IL (US)

( * ) Notice: Subject to any disclaimer, the term of this patent is extended or adjusted under 35 U.S.C. 154(b) by 157 days.

(21) Appl. No.: 13/927,274

(22) Filed: Jun. 26, 2013

(65) Prior Publication Data

US 2013/0285595 A1 Oct. 31, 2013

Related U.S. Application Data

(63) Continuation-in-part of application No. 13/630,865, filed on Sep. 28, 2012.

(60) Provisional application No. 61/541,672, filed on Sep. 30, 2011.

(51) Int. Cl.
*H02J 7/00* (2006.01)
*H01L 31/042* (2014.01)
*H02J 7/35* (2006.01)
*H02J 7/02* (2006.01)
*F24J 2/54* (2006.01)
*F24J 2/52* (2006.01)

(52) U.S. Cl.
CPC ............ *H01L 31/0422* (2013.01); *F24J 2/541* (2013.01); *H02J 7/025* (2013.01); *H02J 7/35* (2013.01); *H02S 20/00* (2013.01); *F24J 2002/5277* (2013.01); *Y02E 10/47* (2013.01)

(58) Field of Classification Search
CPC ........................... H02S 20/00; H01L 31/0422
USPC ......................................................... 320/101
See application file for complete search history.

(56) References Cited

U.S. PATENT DOCUMENTS

| | | | |
|---|---|---|---|
| 3,690,080 A | 9/1972 | Dillard | |
| 4,377,266 A * | 3/1983 | Belew et al. | 244/172.7 |
| 4,386,600 A * | 6/1983 | Eggert, Jr. | 359/852 |
| 5,626,206 A | 5/1997 | Weber et al. | |
| 5,909,955 A | 6/1999 | Roorda | |
| 6,035,973 A | 3/2000 | Neal et al. | |
| 6,044,932 A | 4/2000 | Neal et al. | |
| 6,346,330 B1 | 2/2002 | Huang et al. | |
| 6,474,846 B1 | 11/2002 | Kelmelis et al. | |
| 6,491,413 B1 | 12/2002 | Benesohn | |
| 6,737,573 B2 | 5/2004 | Yeh | |
| 6,899,347 B2 | 5/2005 | Neal et al. | |
| 7,481,440 B2 | 1/2009 | Weber et al. | |

(Continued)

OTHER PUBLICATIONS

International Search Report and Written Opinion for PCT/US12/57982 dated Dec. 27,2012.

*Primary Examiner* — Suchin Parihar
(74) *Attorney, Agent, or Firm* — Mark Stallion; Husch Blackwell LLP

(57) ABSTRACT

An apparatus and method for portable solar panel assemblies configured to enable the unit to be transported by multiple means in order to provide both grid tied and off grid power as needed. Solar panel assemblies are configured to have a range of rotation of approximately 0 to 25 degrees in two directions to allow efficient sunlight capture. The solar panel assembly in the closed position will allow for more compact and aerodynamic profile when being transported.

22 Claims, 23 Drawing Sheets

(56) References Cited

U.S. PATENT DOCUMENTS

| | | |
|---|---|---|
| 2003/0063471 A1 | 4/2003 | Krietenstein et al. |
| 2007/0044415 A1 | 3/2007 | Merrifield et al. |
| 2008/0196758 A1 | 8/2008 | McGuire |
| 2009/0084429 A1 | 4/2009 | Sureda Alsina et al. |
| 2009/0178703 A1 | 7/2009 | Gumm |
| 2009/0194669 A1* | 8/2009 | Noble et al. ............... 250/203.4 |
| 2009/0207623 A1 | 8/2009 | Schutte |
| 2009/0288695 A1 | 11/2009 | Jaisinghani |
| 2010/0020551 A1 | 1/2010 | Kay et al. |
| 2010/0051015 A1* | 3/2010 | Ammar ......................... 126/600 |
| 2010/0051016 A1* | 3/2010 | Ammar ......................... 126/600 |
| 2010/0051018 A1* | 3/2010 | Ammar et al. ................ 126/634 |
| 2010/0051083 A1* | 3/2010 | Boyk ............................ 136/244 |
| 2010/0108120 A1 | 5/2010 | Lin et al. |
| 2010/0206303 A1* | 8/2010 | Thorne ......................... 126/696 |
| 2010/0206354 A1 | 8/2010 | Greene, Jr. et al. |
| 2010/0223865 A1 | 9/2010 | Gonzalez |
| 2010/0282943 A1* | 11/2010 | Boyk ........................... 250/203.4 |
| 2010/0314509 A1* | 12/2010 | Conger ........................ 248/121 |
| 2011/0079214 A1* | 4/2011 | Hon ............................. 126/573 |
| 2011/0146751 A1 | 6/2011 | McGuire et al. |
| 2011/0155218 A1* | 6/2011 | Buchel et al. ................ 136/246 |
| 2011/0174295 A1* | 7/2011 | Clavijo Lumbreras ....... 126/605 |
| 2011/0181018 A1 | 7/2011 | Bruneau |
| 2012/0113642 A1 | 5/2012 | Catalano |
| 2012/0186632 A1* | 7/2012 | Reinhold et al. ............. 136/251 |
| 2012/0291374 A1* | 11/2012 | Zante ........................... 52/173.3 |
| 2013/0082637 A1* | 4/2013 | Eaton et al. .................. 320/101 |
| 2013/0180568 A1* | 7/2013 | Hartelius ..................... 136/246 |
| 2014/0137925 A1* | 5/2014 | Boyk ............................ 136/246 |

\* cited by examiner

PORTABLE SOLAR PANEL POWER SOURCE

CROSS REFERENCE

This application is a continuation-in-part of U.S. Non-Provisional application Ser. No. 13/630,865 entitled PORTABLE SOLAR PANEL POWER SOURCE, Filed Sep. 28, 2012, which claims priority to and the benefit of U.S. Provisional Patent Application Ser. No. 61/541,672 entitled PORTABLE SOLAR PANEL POWER SOURCE, Filed Sep. 30, 2011, and is incorporated herein in its entirety.

BACKGROUND OF INVENTION

1. Field of Invention

This invention relates generally to solar power and solar panels and, more particularly, to portable and/or mobile solar panels.

2. Background Art

The embodiments herein relate to solar panel assemblies configured so as to be relocated by multiple means, including but not limited to trailer, freight container, and air lifted. More specifically, the teachings herein can be used to charge banks of batteries, and/or used as portable power plants during emergencies and be fully deployed as full time grid tied power plant as well. It has become apparent in light of recent natural disasters, terrorist attacks and military deployments that power outages in areas of concern can happen suddenly. There is a need for emergency management responders and military personnel to have portable power plants that are self sustaining and reliable even under adverse conditions. Fossil fuels for engine based power generators are not always available. Also, a heavy transport means is not always available. Therefore, a stand alone, self sustaining system that can be easily transported is needed.

BRIEF SUMMARY OF INVENTION

One implementation of the portable power system includes a solar panel assembly having multiple solar panels that are attached to hinged fan-folded panel frames. The panel frames have spring assisted hinges and are configured in an accordion type or fan-folded type configuration and secured to a rotating (pivoting) cradle assembly that is mounted to a single center pivot such that the cradle assembly rocks (rotates; pivots) on and about the center pivot.

The hinged fan-folded panels can be designed to expand laterally outward from the cradle assembly along and support by trusses that are laterally extendable from the cradle assembly. The truss can be retractable within the cradles assembly and extendable from the cradle assembly thereby supporting the panels as they are laterally expanded on top of the extended truss supports thereby configuring a cradle support frame and the cradle support frame can be designed with the center pivot such that the entire cradle support frame can rock (pivot) on the center pivot to thereby allow the angle of the panels to vary up to about +/−25 degrees off horizontal. The solar panel assembly can be mounted on a wheeled trailer (not shown) for transport or placed on the bed of a truck or similar means of transport.

One implementation of the portable power station apparatus includes a rocker frame having spaced apart opposing vertically upright bearing frames substantially perpendicularly extending from the rocker frame on opposing distal end (sides) of the rocker frame, where the opposing vertically upright bearing frames each have respective opposing pivots. A cradle frame can be included having an extendable truss support member, where distal opposing ends of said cradle frame are respectively pivotally mounted on opposing pivots to thereby allow the cradle frame to rock (pivot) on the pivots of the bearing frames. A plurality of fan-folded panel frames hingedly attached side-to-side each framing a plurality of solar panels can be mounted on the cradle frame, where said fan-folded panel frames are expandable to extend over the extendable truss support member when deployed.

Another implementation of the portable power station apparatus includes a rocker frame having spaced apart opposing vertically upright bearing frames substantially perpendicularly extending from the rocker frame on opposing distal end (sides) of the rocker frame, where the opposing vertically upright bearing frames each have respective opposing pivots mounted thereon. A removably mounted cradle frame can be included having an extendable truss support member, where distal opposing ends of said cradle frame are respectively pivotally mounted on opposing pivots to thereby allow the cradle frame to rock (pivot) on the pivots of the bearing frames. A plurality of panel frames having opposing distal ends where each end has a roller track mounted along an upper edge of each end and a roller rotatably mounted along a lower edge of each end and the roller is positioned to engage a roller track of a spring loaded elevation bracket and engage the roller track mounted along the upper edge of the adjacent panel frame when vertically lowered by the elevation bracket when stowing the panels. When the panel frames are deployed, the roller of each panel tracks along and on the roller track of the support truss and are abutted side by side. When the panes are stowed, a mechanical crank can be used to lower the elevation bracket downward along a vertical track, which vertically lowers the inner-most (bottom) panel to a height where the roller of the immediately adjacent panel is able to engage the roller track mounted along the upper edge of the previous panel. The panels are vertically lowered on by the elevation rack and stacked one atop the other. The elevation rack can be designed such that as a panel is stacked on top of the previously lowered panel, the weight of the panel further lowers the stack such that the next panel can be rolled to engage the roller track mounted on the upper edge of the previous panel.

One implementation of a portable power station assembly includes a rocker frame having spaced apart opposing vertically upright bearing frames extending from a base portion of the rocker frame at opposing distal ends of the base portion of the rocker frame, where the opposing vertically upright bearing frames each have respective opposing pivot bearing members. A cradle frame can extend between and can be pivotally attached to the opposing pivot bearing members and have a truss support member pivotally attached to the cradle frame to swing inward toward for stowing and outward away from the cradle frame for deployment, where said truss support includes a roller track extending lengthwise along a top support chord of the truss support member, where distal opposing ends of said cradle frame are respectively pivotally mounted on opposing pivots. A panel frame can be adapted to receive solar panels and each panel frame including a roller that engages the roller track of the truss support member such that the panel is operable to traverse the length of the truss support member along the roller track of the truss support. The truss supports can include end stops to prevent a panel from rolling of the end of the truss support. The cradle frame can further include a vertical elevation track having an elevation rack adapted for tracking and traversing vertically on the elevation track where the elevation rack has a rack support bar extending horizontally away from the vertical elevation track.

Another implementation of a portable power station assembly includes a rocker frame having spaced apart opposing vertically upright bearing frames extending from a base portion of the rocker frame at opposing distal ends of the base portion of the rocker frame, where the opposing vertically upright bearing frames each have respective opposing pivot bearing members. A cradle frame can extend between and can be pivotally attached to the opposing pivot bearing members having two pair of truss support members each hingedly attached to the cradle frame to swing inward toward for stowing and outward away from for deploying the cradle frame, and where each of the pair of truss support members are attached on opposing sides of the cradle frame and each truss within each pair is attached on opposing distal ends of the cradle assembly where each of said truss supports include a roller track extending lengthwise along a top support chord of the truss support member, where distal opposing ends of said cradle frame are respectively pivotally mounted on opposing pivots. A panel frame can be adapted for receiving solar panels including a pair of roller sets where each roller set within the pair are rotatably attached on distal opposing ends of the panel frame and each roller set positioned to engage the roller track of one of said truss support members within the pair of truss support members such that the panel frame is operable to traverse the length of the pair of truss support members along the roller tracks of the truss support members. The cradle frame can further include a vertical elevation track having an elevation rack adapted for engaging, tracking and traversing vertically on the elevation track where the elevation rack has a pair of rack support bars extending horizontally away from the vertical elevation track.

This implementation provides for a lighter-weight assembly where the support trusses can properly stow and the panels can be incrementally lowered and stowed using the elevation rack. This implementation also lowers the center of gravity of the assembly when the panels are stowed for transportation.

These and other advantageous features of the present invention will be in part apparent and in part pointed out herein below.

BRIEF DESCRIPTION OF THE DRAWINGS

For a better understanding of the present invention, reference may be made to the accompanying drawings in which.

Figure 1:
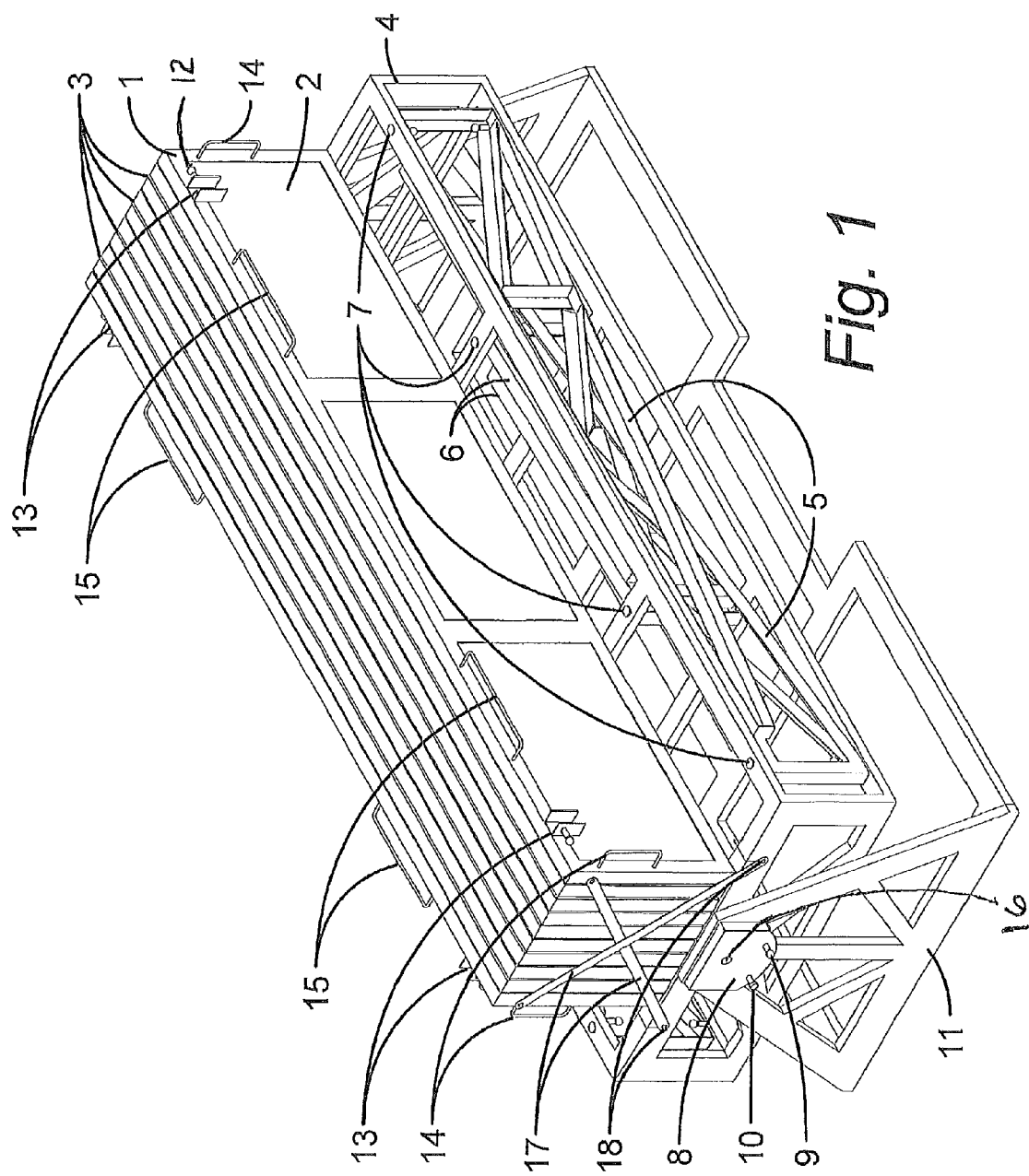
FIG. 1 is a perspective of the solar panel assembly, in an unexpanded position.

While the invention is susceptible to various modifications and alternative forms, specific embodiments thereof are shown by way of example in the drawings and will herein be described in detail. It should be noted that the drawing is not necessarily to actual scale and proportion, however clearly illustrates the various aspects of the various embodiments of the invention. It should also be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims as would be apparent to persons skilled in the art area.

DETAILED DESCRIPTION OF INVENTION

According to the embodiment(s) of the present invention, various views are illustrated in FIG. 1-5 and like reference numerals are being used consistently throughout to refer to like and corresponding parts of the invention for all of the various views and figures of the drawing. Also, please note that the first digit(s) of the reference number for a given item or part of the invention should correspond to the Fig. number in which the item or part is first identified.

One implementation of the portable power system having a deployable fan folded solar panel teaches a novel apparatus and method for providing a portable solar powered power source. The details of the invention and various embodiments can be better understood by referring to the figures of the drawing. Referring to FIG. 1, a complete solar panel assembly having hinged fan-folded panel frames (1) containing solar panels in the closed position is shown. The hinged fan-folded panel frames (1) hold the solar panels (2) and can be designed to expand outward along supporting retractable trusses by engaging a u-shaped mounting track of the panel frames with the trusses, which expand out from the cradle assembly (4). The legs of the u-shaped mounting track (u-shaped bracket) can straddle on either side of the truss to thereby align the movement of the panels as they extend and restrict lateral movement of the panels as they are extended.

The hinges can be spring assisted for ease of extending and ease of retraction. The main support frame or rocker frame (11) can be designed with a center pivot point or fulcrum to allow the panel frames and solar panels to vary in angle off horizontal when the panels are extended. The assembly can be designed to allow for a variance in angle of up to about +/−25 degrees off horizontal. The multiple panel frames (1) can be hingedly attached side-to-side and retracted in a fan-folded manner using spring assisted hinges (3) to assist expanding and retracting the panel frames. When in the folded position, support straps (17) can be attached between support pins (18) to stabilize the assembly. The cradle assembly (4) or the main support frame can include inner trusses (6) and outer trusses (5) as shown in the retracted position. When deployed, the trusses can swing outward pivoting around pivot pin (7) from the cradle assembly for operational support of the extended solar panels.

When the trusses (5) and (6) are deployed, the outer most panel frames can be un-folded or the top most side of the outer most panel frame can be rotated outward and downward to a flat position against the supporting trusses and thereby engaging the u-shaped bracket (13). The side handles (14) and the horizontal handles (15) can be grasped and utilized to expand and stow the panel frames. The opposing legs of the u-shaped bracket (13) can be aligned on either side of the top alignment bar of the outer trusses such that the panel frames can track along the trusses as they are being expanded. The u-shaped bracket (13) can track along the top alignment bar of the outer trusses. The legs of the u-shaped bracket can resist or prevent lateral movement of the panels. The u-shaped brackets can include channel spring pins (12), which can be retracted to allow the u-shaped bracket to engage the outer trusses and then released to engage a lengthwise groove or recess on the side of the top alignment bar of the outer trusses to thereby lock the panel in place.

The cradle assembly (4) can be pivotally mounted on a supporting rocker frame (11) having opposing upright bearing frames on opposing sides of the rocker frame such that opposing sides of the cradle assembly each are pivotally mounted at opposing pivot points or fulcrums of the opposing upright bearing frames of the rocker frame. The pivot points on which the cradle assembly is mounted can be pivot point pins or bearings (16) or the pivot points can be created by pivot rod that extends between opposing fulcrums of the opposing upright bearing frames. The spring pin and safety bolt can be released to allow the cradle assembly to pivot or "see-saw" about the fulcrum or pivot point. The cradle can then act as a lever to tilt the cradle up or down to approximately +/−25 degrees off horizontal. The support plate (8) can be added for additional strength. Another implementation, not shown, could include a center rocker frame or center upright stand having a pivot point or fulcrum centered on the cradle assembly and where the center rocker frame is centered under the cradle assemble, similar to the design of a "see-saw".

The solar panel assembly can be mounted on a wheeled trailer (not shown) for transport or placed on the bed of a truck or similar means of transport. The assembly can also be placed in a standard 20'×10'×10' container and transported to a location where the assembly can be mounted to a more permanent structure. Once in position and operational the solar panel assemble can operate as an on-grid and off-grid power source. One embodiment of the system allows multiple systems to be daisy chained together. One embodiment of the assembly can include a bank of batteries the can be charged by the solar cells. An operational system can provide 7500 watts of power. Yet another embodiment can include a backup power source such as a combustion engine. The assembly can also include military grade fused link faraday boxes such that the system is electromagnetic pulse resistant.

Figure 2:
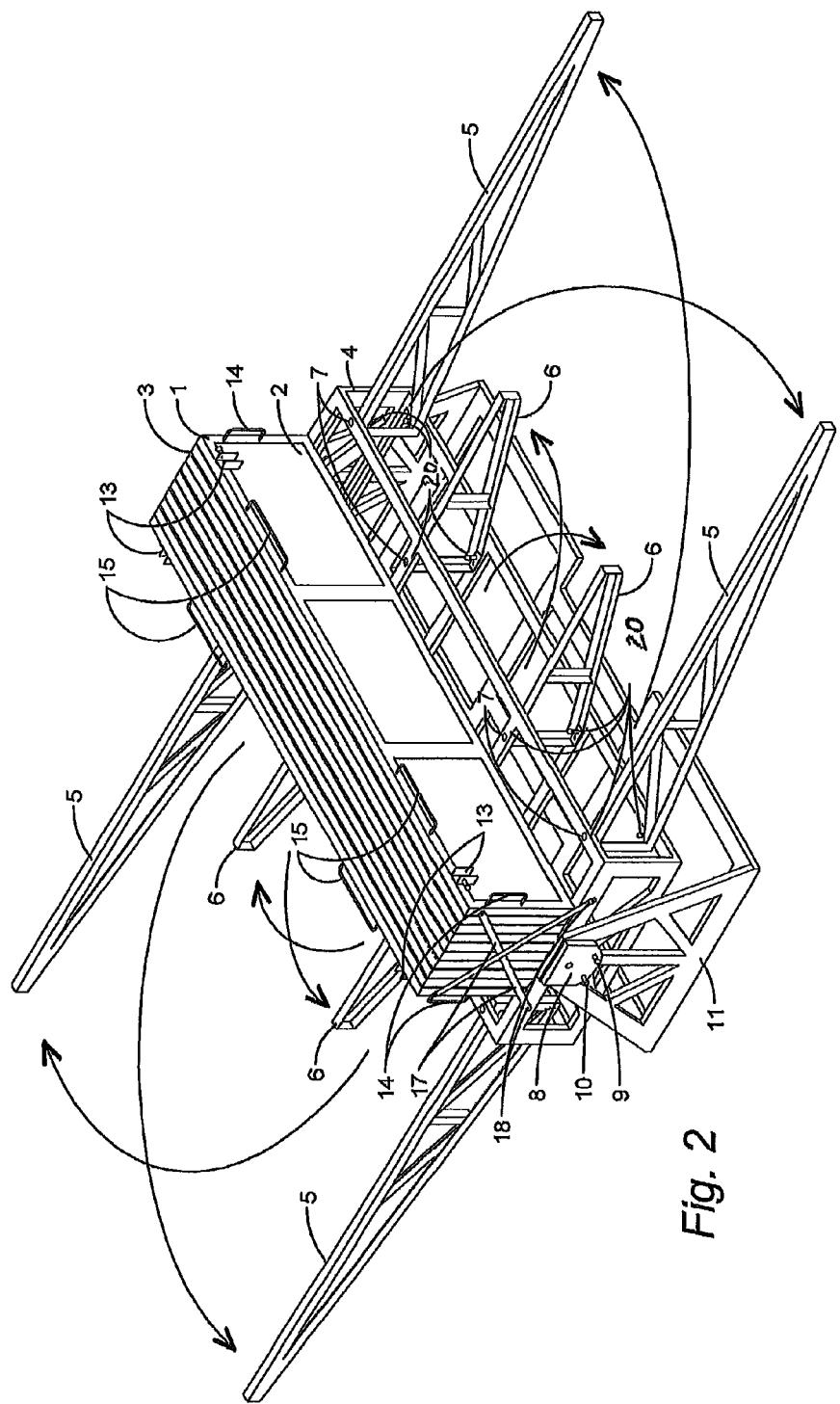
FIG. 2 is a perspective of the solar panel assembly, trusses being extended.

Referring to FIG. 2, the trusses (5) and (6) are illustrated as being opened (extended outward from the cradle assembly) in order to support the solar panels from underneath. Each truss (5) and (6) can be mounted to the main support frame with a hinge or a pivot mount. In the embodiment shown, the trusses are released by the spring pin (20) and rotated from a stowed position within the main frame or flush against the frame, out away from the main frame (as indicated by the arrows) on pivot rods (7) to an orientation substantially perpendicular to the main frame to an open position. Once the trusses (5) and (6) are in the open position, the spring pin (20) can be released locking the truss in position. The spring pin (20) locates and holds the truss (5) and (6) in the proper location. The straps (17) can be removed and the handles (14) and (15) can be grasped to pull the top ends of the outer most panel frames downward to engage the u-shaped brackets (13) with the outer trusses (5). This process can be repeated for each of the trusses and on either side of the main frame.

Figure 3:
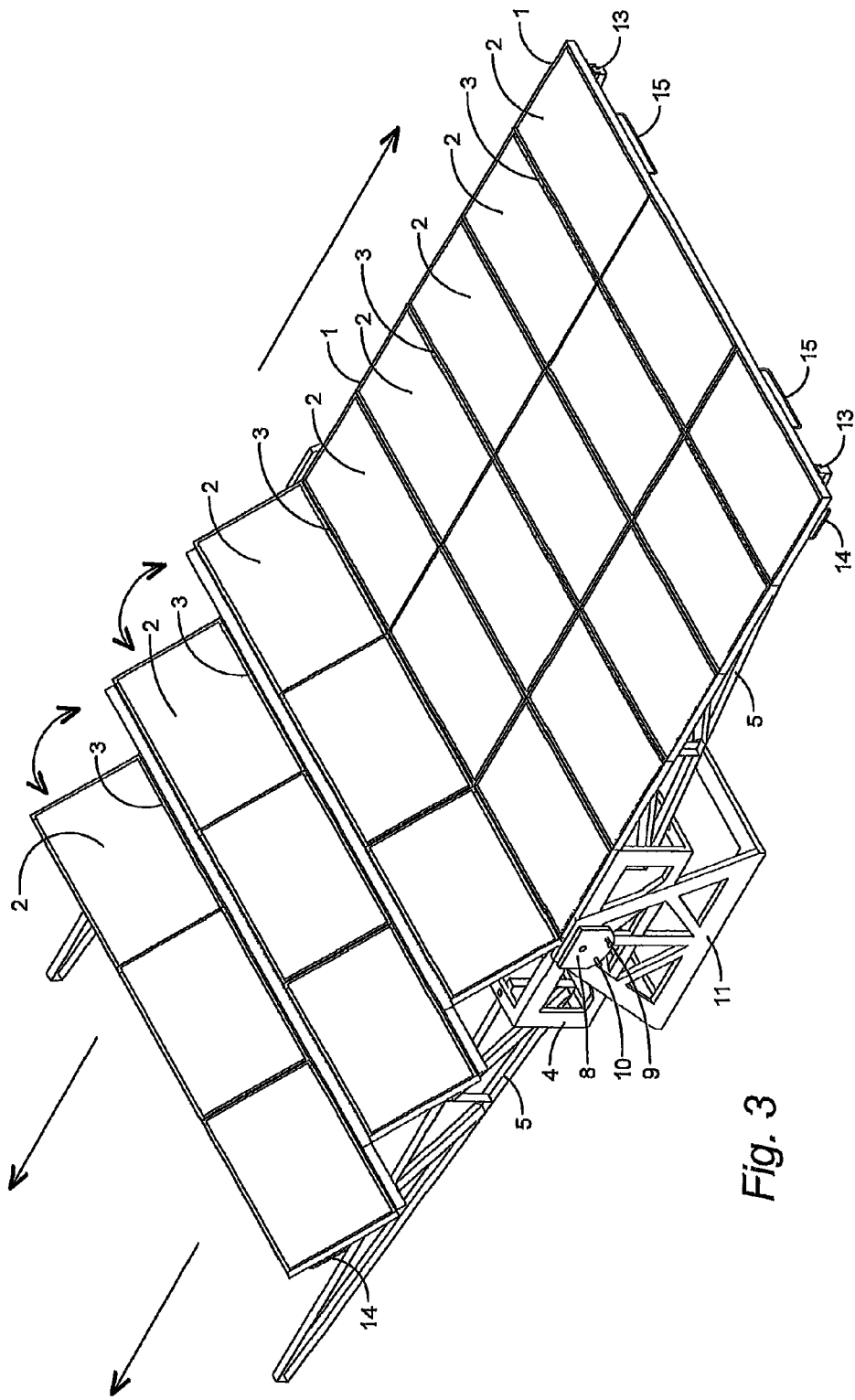
FIG. 3 is a perspective of the solar panel assembly, solar panels being expanded.

Referring to FIG. 3, the solar panels (2) are mounted in the panel frames (1) and the panels are hinged in an accordion or fan-folded type configuration. This allows the panel frames (1) to be opened (extended) and closed (retracted). To open, release one side of the support strap (17) (FIG. 2), pull handles (14) and (15) mounted to the panel frames (1) into the open position. The spring actuated assist hinges (3) helps to eliminate any unwanted movement. Also, the spring actuated assist hinge (3) assists in the opening and closing of the panels frames (1). Once open, use the u-shaped bracket's spring pin (12) to lock in place. The process is repeated on opposite side. The u-shaped bracket (13) in this view is shown engaged with the top bar of the outer trusses. The cradle assembly (4) in this view is shown in a substantially horizontal orientation.

Figure 4:
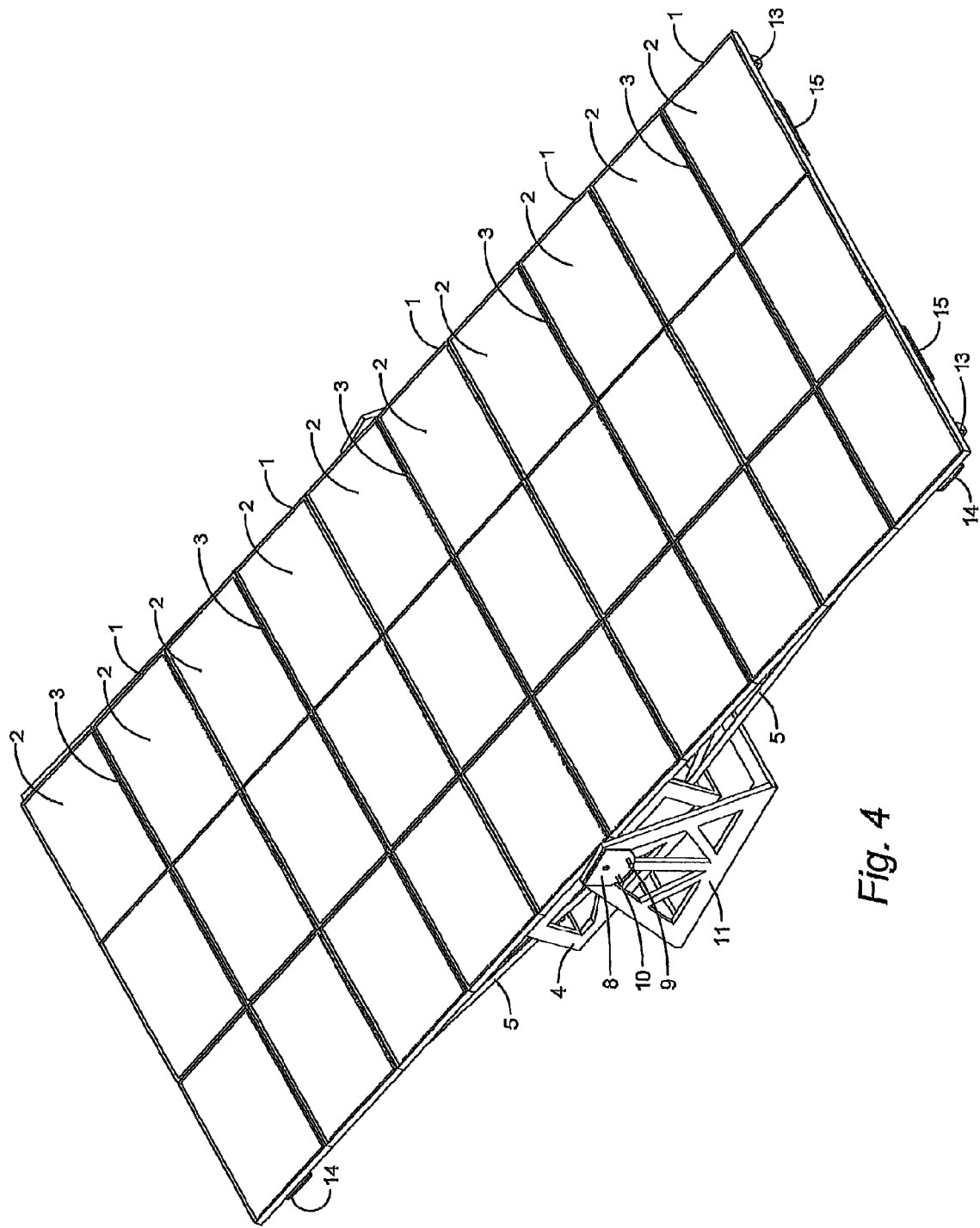
FIG. 4 is a perspective of the solar panel assembly, solar panels in an expanded position with the solar panels pivoted off horizontal.

Referring to FIG. 4, the assembly is shown with panels and supporting trusses fully expanded and the cradle in this view is shown with a slight tilt (angle) off horizontal. The cradle assembly and frame panels have been tilted or pivoted about the pivot point (fulcrum) (8) of the rocker frame (11).

Figure 5:
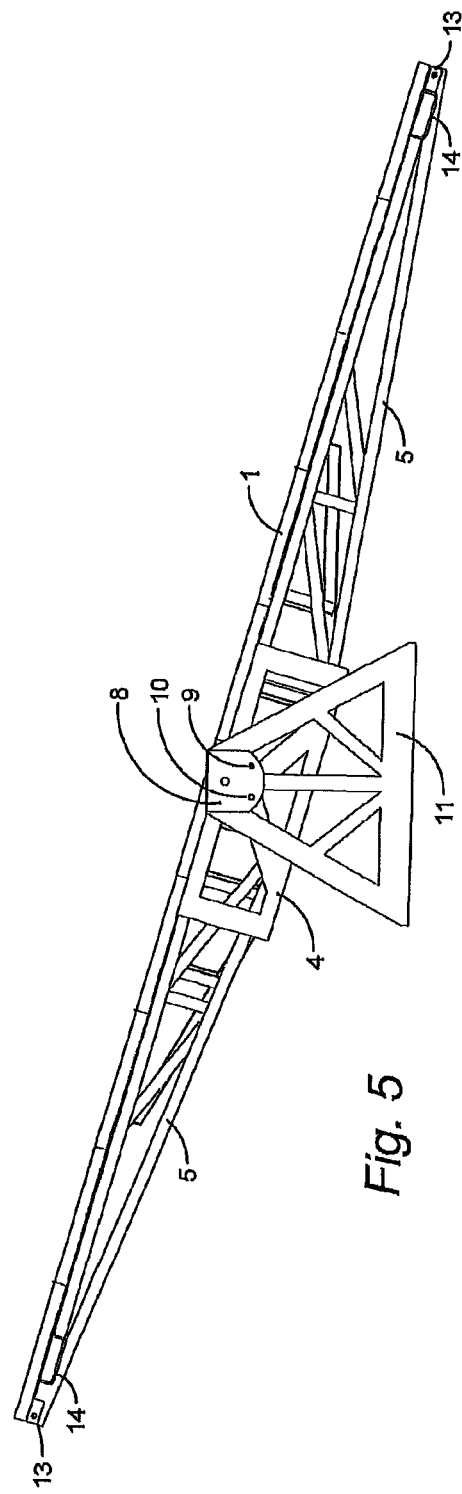
FIG. 5 is a side elevation of the solar panel assembly with solar panels in an expanded position with the solar panels pivoted off horizontal.

Referring to FIG. 5, after unit is fully expanded, the safety bolt (10) can be removed, and the spring pin (9) located on the rocker frame (11) can be pulled and released. The rocker frame's fulcrum (pivot point) can allow the cradle assembly (4) to "see-saw" or pivot (rock) on the pivot thereby allowing either opposing side of the cradle assembly to tilt up or down to about +/−25 degrees off horizontal, left or right, the locater holes on the support plate (8) for proper positioning. The spring pin (9) can be released and locked into place with the safety bolt (10).

In order to stow the assembly the cradle (4) can be pivoted back into the horizontal flat position. The safety bolt (10) can be removed, the spring pin (9) located on the rocker frame (11) can be pulled and released. The channel spring pins (12) of the u-shaped bracket (13) that holds the panels to the truss can be pulled and released. By lifting up using the handles (14) and (15) and sliding the panels into the closed position, the panels can be returned to the stowed fan-folded position. Once closed, one side of the support strap (17) (FIG. 2) can be attached. This can be repeated on opposite side.

In order to close trusses (5) and (6) the spring pin (20) can be pulled and released to fold the truss into the cradle (4) returning it to the stowed position. The trusses (5) and (6) can now be secured in the cradle (4) during transporting.

When deploying the solar panel assembly, a user can always position the unit so that when it is opened it will face north and south. Once open, it can rotate either direction, ensuring that the unit will always face south.

Figure 6:
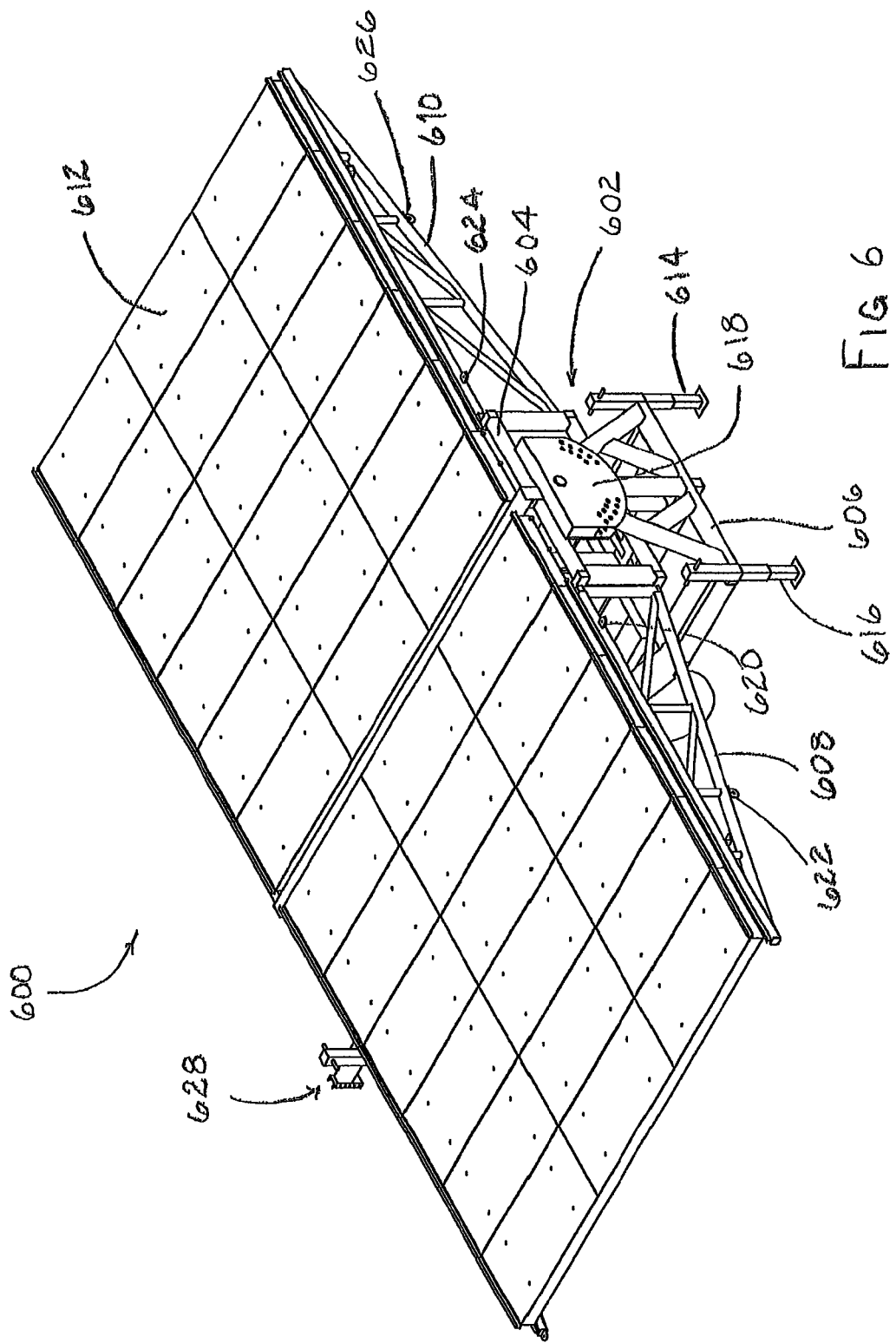
FIG. 6 is a top perspective view of the portable solar panel power source.

A further implementation of a portable solar panel assembly power source is shown in FIGS. 6-23. This further implementation provides another rocker assembly and cradle assembly design. In addition, another implementation for stowing the panel frames and associated solar panels is provided. Also, another implementation for stowing the trusses is provided. Referring to FIG. 6, a top perspective view of the fixed member embodiment of the portable solar panel assembly 600 is shown as another implementation of a portable solar panel assembly and said implementation is further illustrated in FIGS. 7-23. The assembly has two oppositely extending panel groups having multiple panel assemblies 612 each having panel support frames, where each panel frame is adapted to receive a solar panels. The panel frames can be made of light-weight composite material, or metal or other comparable material. The solar panels are removably installed in the panel frame. The panel assembly including the solar panels installed in the panel frames is supported by trusses 608 and 610. The assembly also includes a cradle assembly 604 that is adapted to pivot or rock to adjust its angle with respect to horizontal. The cradle assembly 604 is supported by rocker assembly 606, which supports the cradle assembly. The rocker assembly further includes support jacks 614 and 616 and a towing hitch 628. The trusses 608 and 610 can include eyelet tabs 622 and 626 for securing the unit during high wind conditions, and eyelet tabs 624 and 620 are used to secure support trusses when in the closed position during transportation. The rocker assembly is further stabilized by the jacks 614 and 616. The positioning plate (adjustment plate) 618 is utilized for adjusting and fixing the angle off horizontal.

Figure 7:
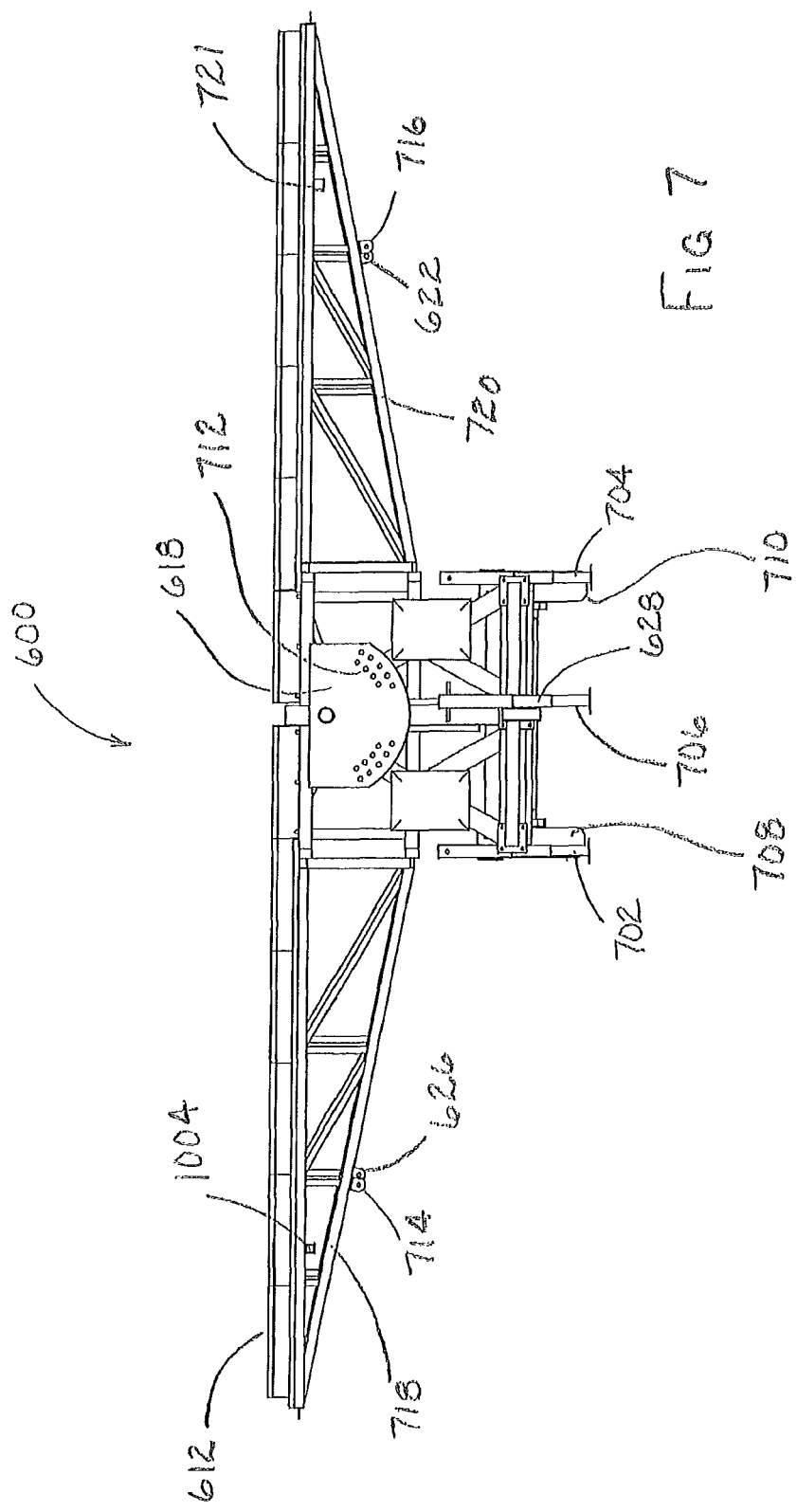
FIG. 7 is a front elevation view of the portable solar panel power source.
Figure 8:
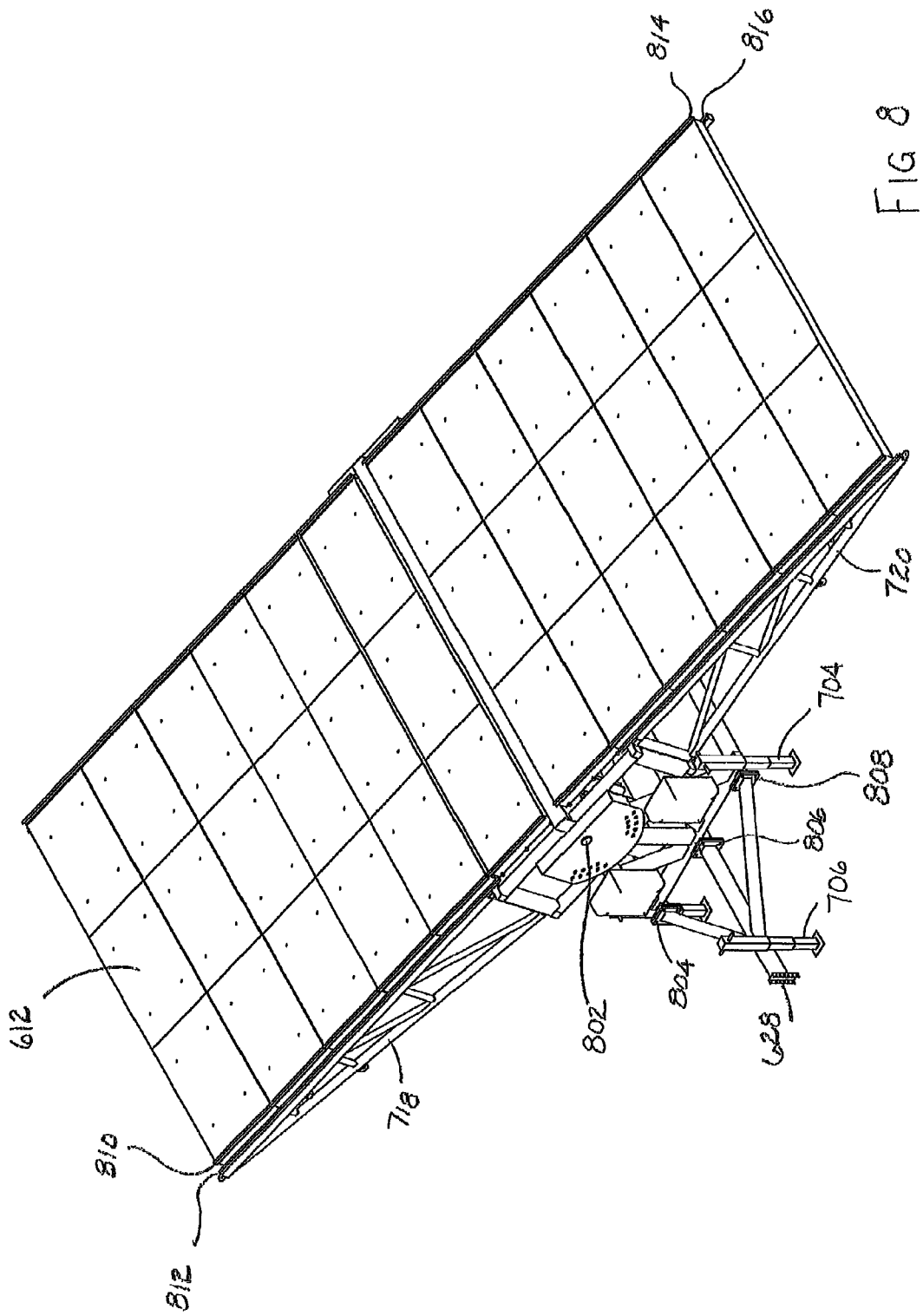
FIG. 8 is a top perspective view of the portable solar panel power source with the panels in a tilted position.

Referring to FIG. 7, a front elevation view of the portable solar panel power source is shown. This view reveals that the assembly further includes support jacks 702, 706 and 704 and wheels 708 and 710. This view also reveals additional supporting trusses 718 and 720 and additional eyelet tabs 714 and 716. The assembly includes wheels 708 and 710 for assistance in maneuvering the overall assembly. The adjustment locking plate 618 includes angular adjustment hole positions 712 for locking the panel arrays at a particular angle with respect to horizontal by inserting a locking pin. This view also reveals support/stabilizer beam 721 and 1004. FIG. 8 illustrates another top perspective view where the panel roller tracks 810 extend along and are mounted on an upper edge of one end of the panel frames and the top chord roller tracks of the truss 812 extend along its length on the upper supporting edge of the truss. Each panel frame will have an opposing roller rack 814 extending along and mounted on the opposing end of a panel and each opposing truss will have an upper roller rack 816. The panels are shown pivoted about pivot 802 at an angle off horizontal. The hitch assembly is removably mounted to the rocker frame by mounting flanges 804, 806 and 808.

Figure 9:
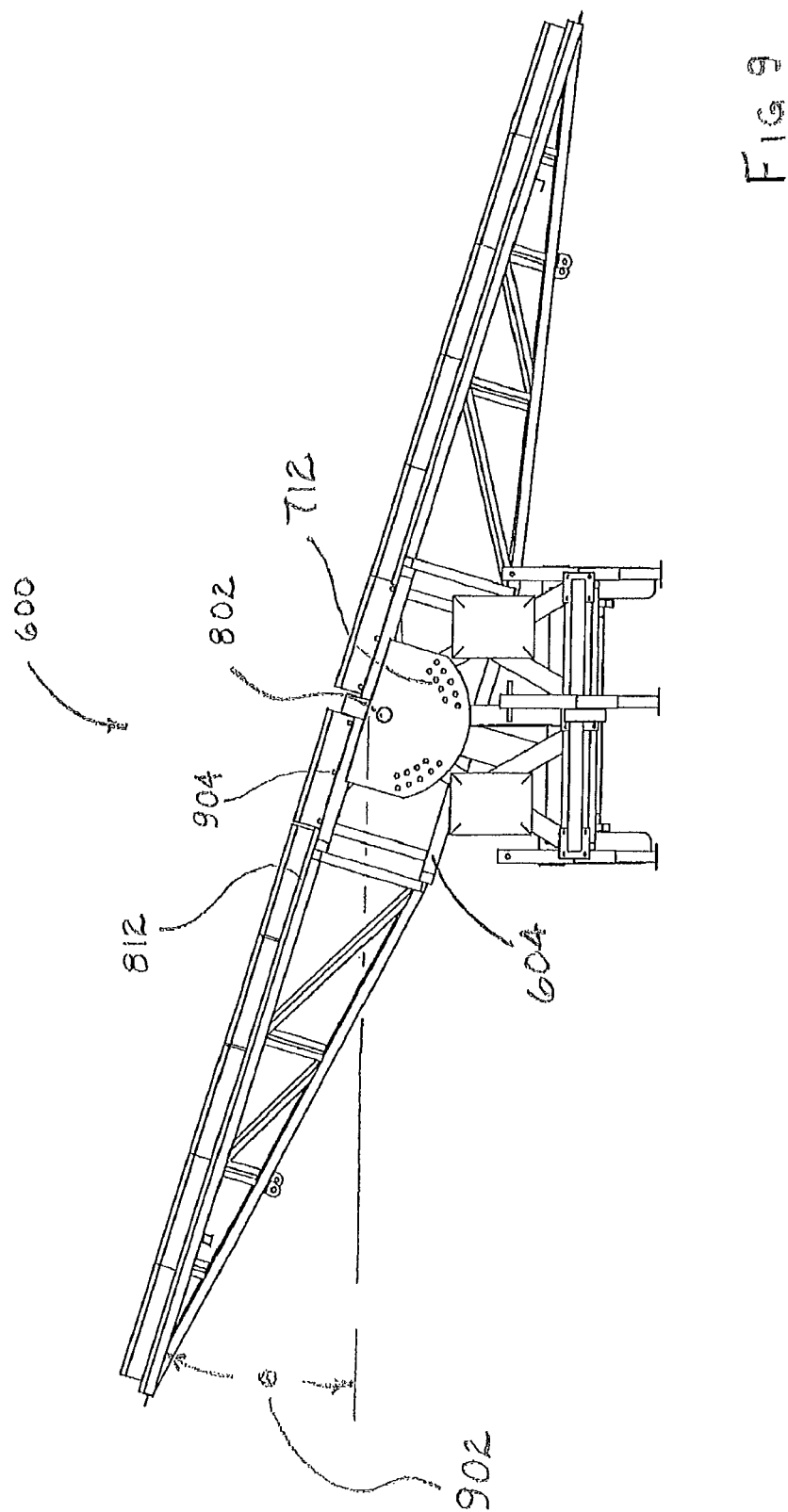
FIG. 9 is a front elevation view of the portable solar panel power source with the panels in a tilted position.

Referring to FIG. 9, a front elevation view of the portable solar panel power source with the panels in a tilted position is shown. The cradle assembly 604 is pivoted about the pivot 802 such that the panels are tilted at an angle θ with respect to horizontal 902. The angle can vary from 0 degrees to about approximately +/−20 degrees off horizontal. When the panels are fully deployed the rollers 904 are engaged with the roller track of the truss. In order to have greater stability, one implementation can be such that the inner most panel assembly (lowermost panel assembly when stowed) can be fixed to the elevator rack. The angular adjustment hole positions 712 can be utilized for locking the panels at a particular angle with respect to horizontal.

Figure 10:
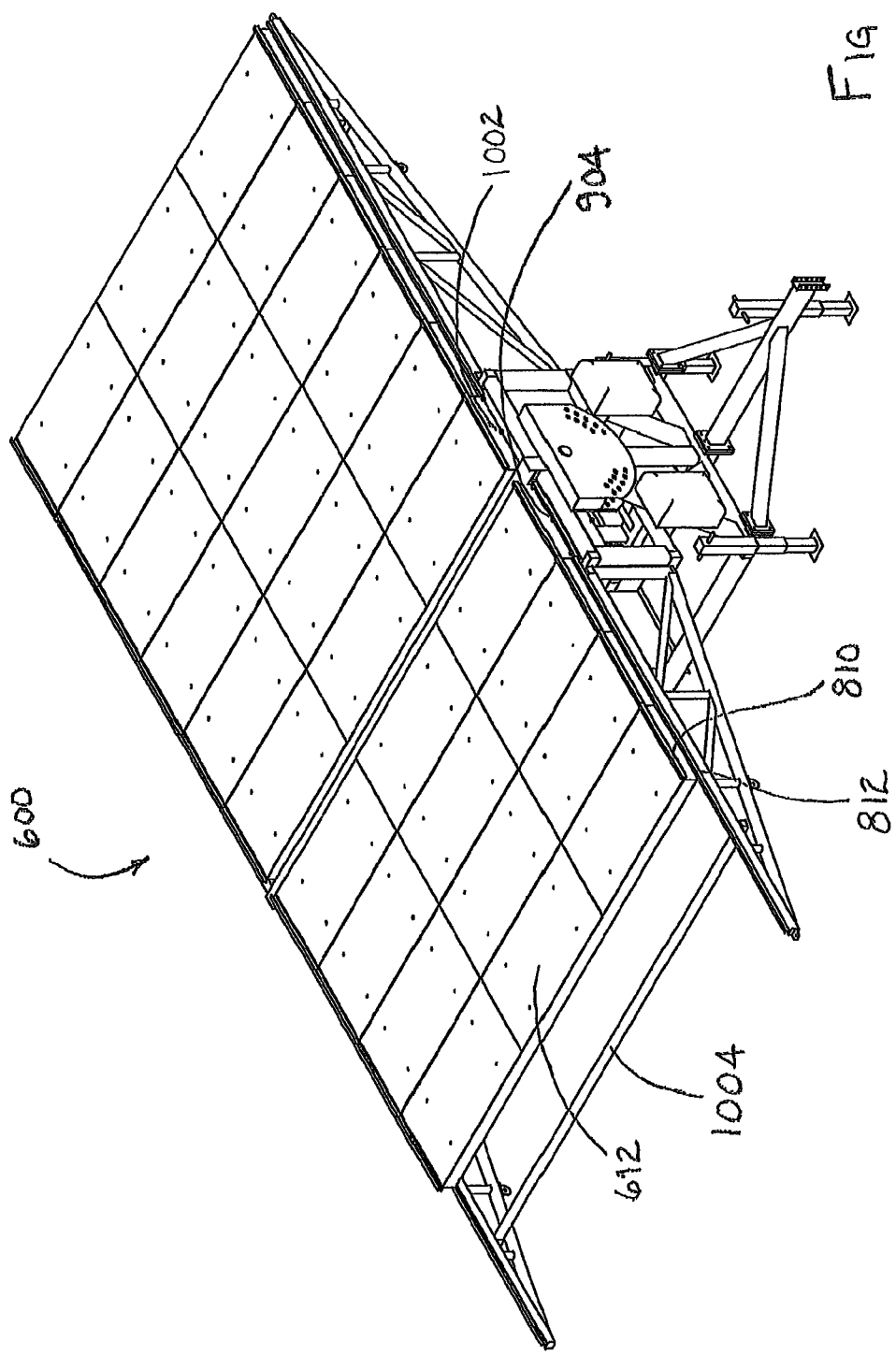
FIG. 10 is a top perspective view of the portable solar panel power source with the panels partially stowed.

Referring to FIG. 10, a top perspective view of the portable solar panel power source with the panels partially stowed is shown. This view illustrates where the inner two most panels on one side have been lowered vertically by the elevation rack and the roller of the subsequent panel 904 engages the roller rack of the upper most panel now supported by the elevation rack. As noted above for greater stability, the innermost panel assemblies can be attached to the elevation rack. Also the, top chord roller tracks 812 of the truss can have end stops to prevent the panel assemblies from traversing off the outer end of the truss. The opposing trusses are shown having a support/stabilizer beam 1004 that can be used for added stability and safety.

Figure 11:
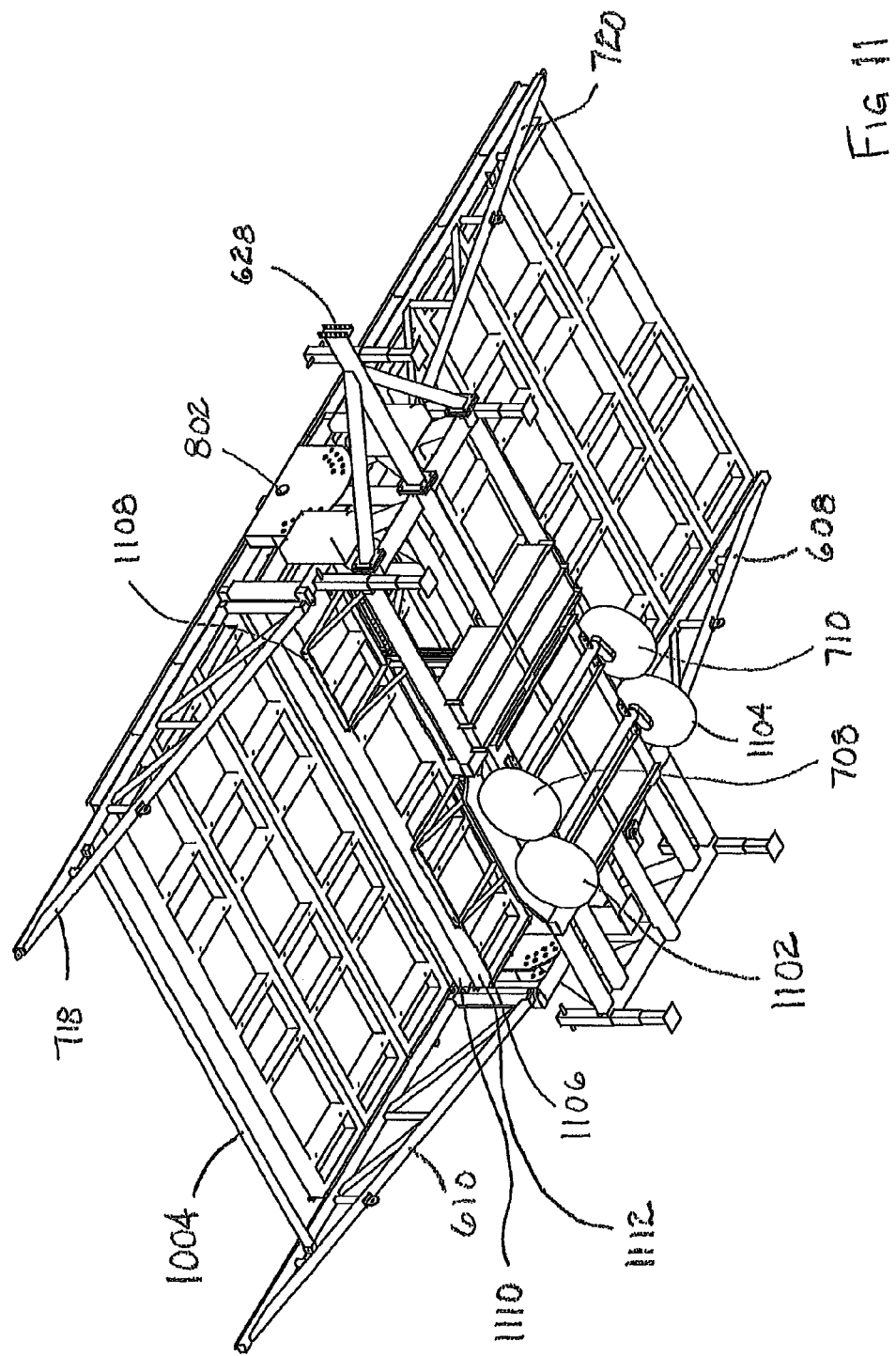
FIG. 11 is a bottom perspective view of the portable solar panel power source with the panels partially stowed.
Figure 12:
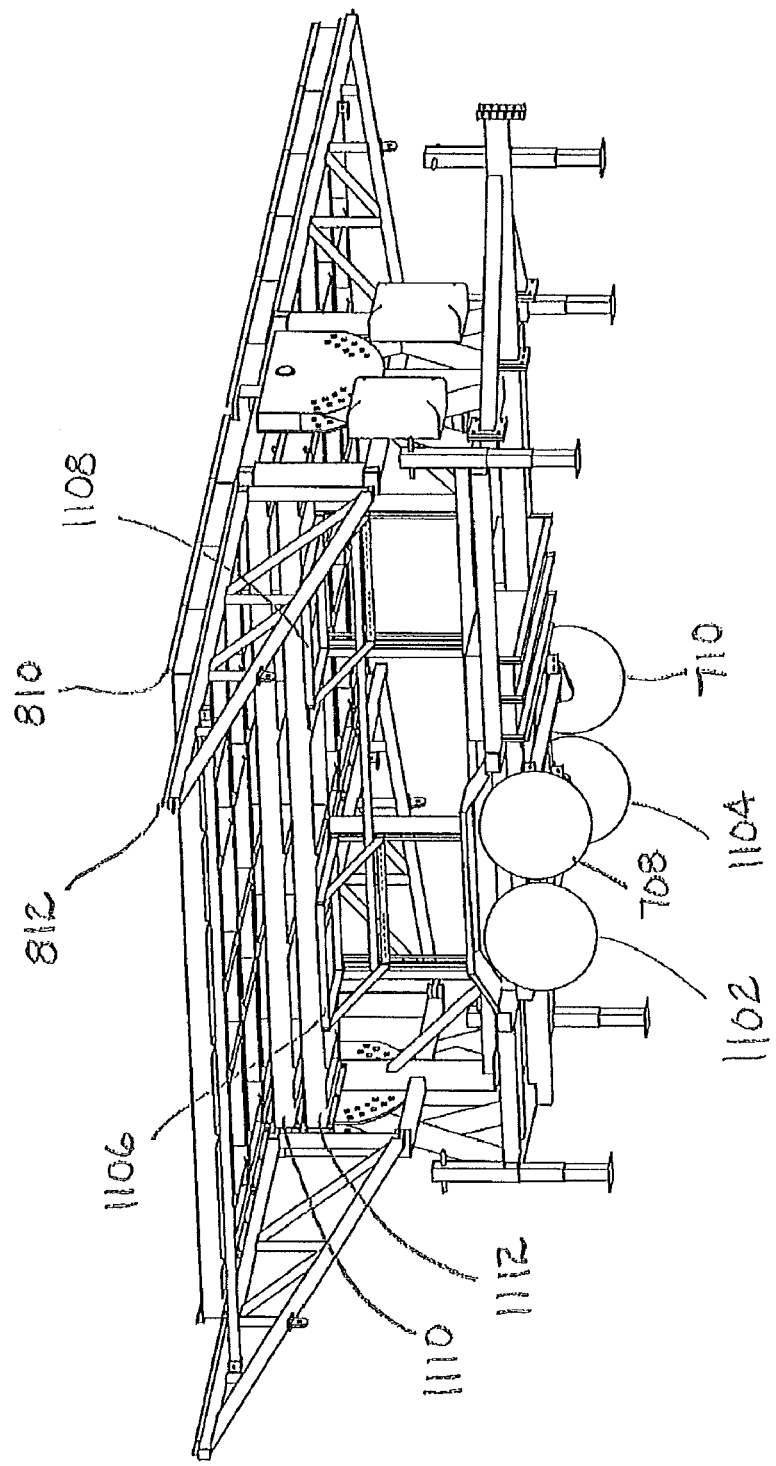
FIG. 12 is a side perspective view of the portable solar panel power source with the panels partially stowed.

Referring to FIG. 11, a bottom perspective view of the portable solar panel power source with the panels partially stowed is shown. This view reveals the undercarriage assembly having two additional wheels 1102 and 1104, which can be utilized for transport of the assembly. The elevation racks 1106 and 1108 are shown vertically lowering the panels 1110 and 1112. The reinforcement bar 1004 provide further support to the trusses. FIG. 12 provides an illustration of a side perspective view.

Figure 13:
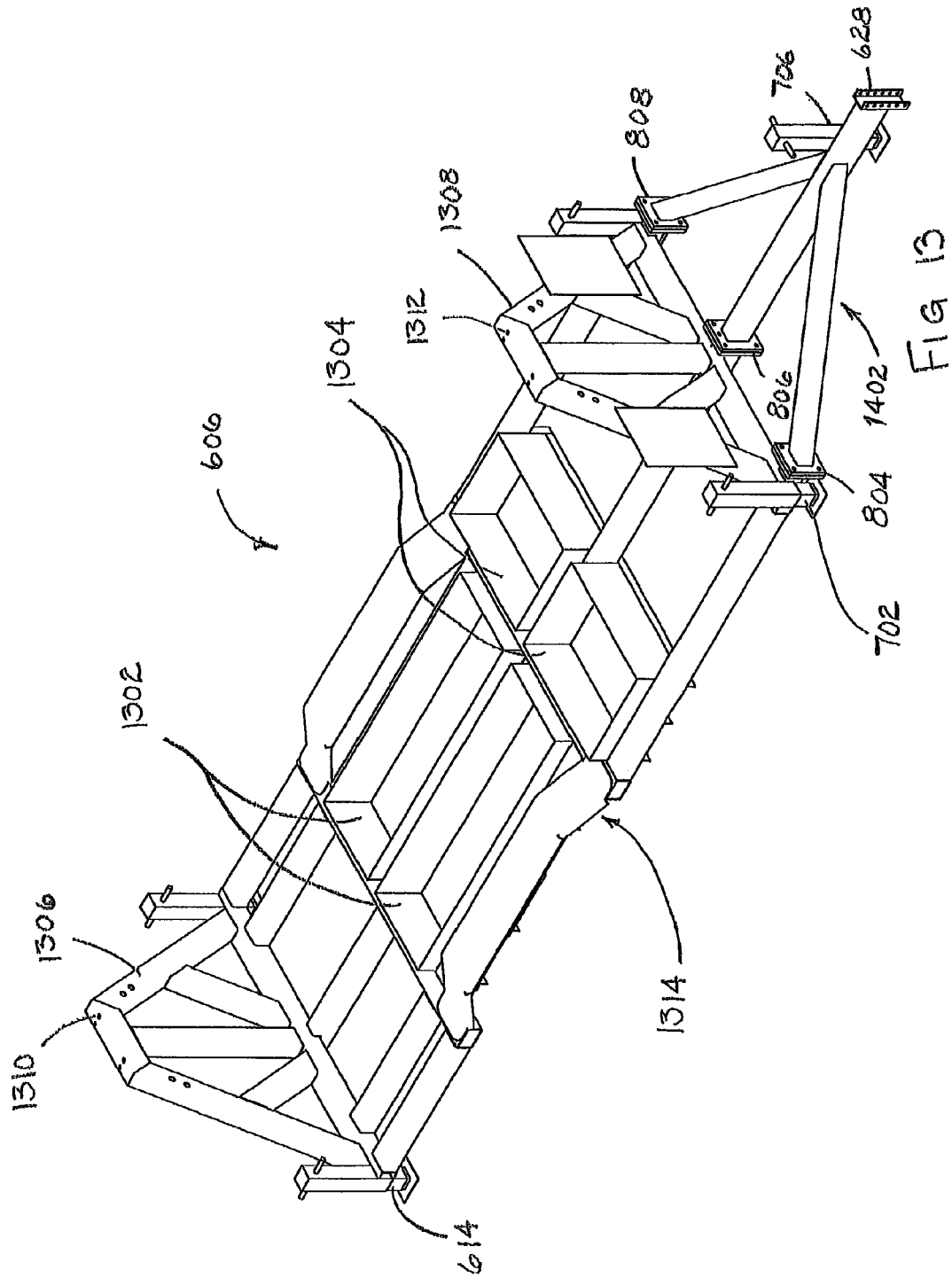
FIG. 13 is a top perspective view of the rocker frame with opposing upright bearing frames.
Figure 14:
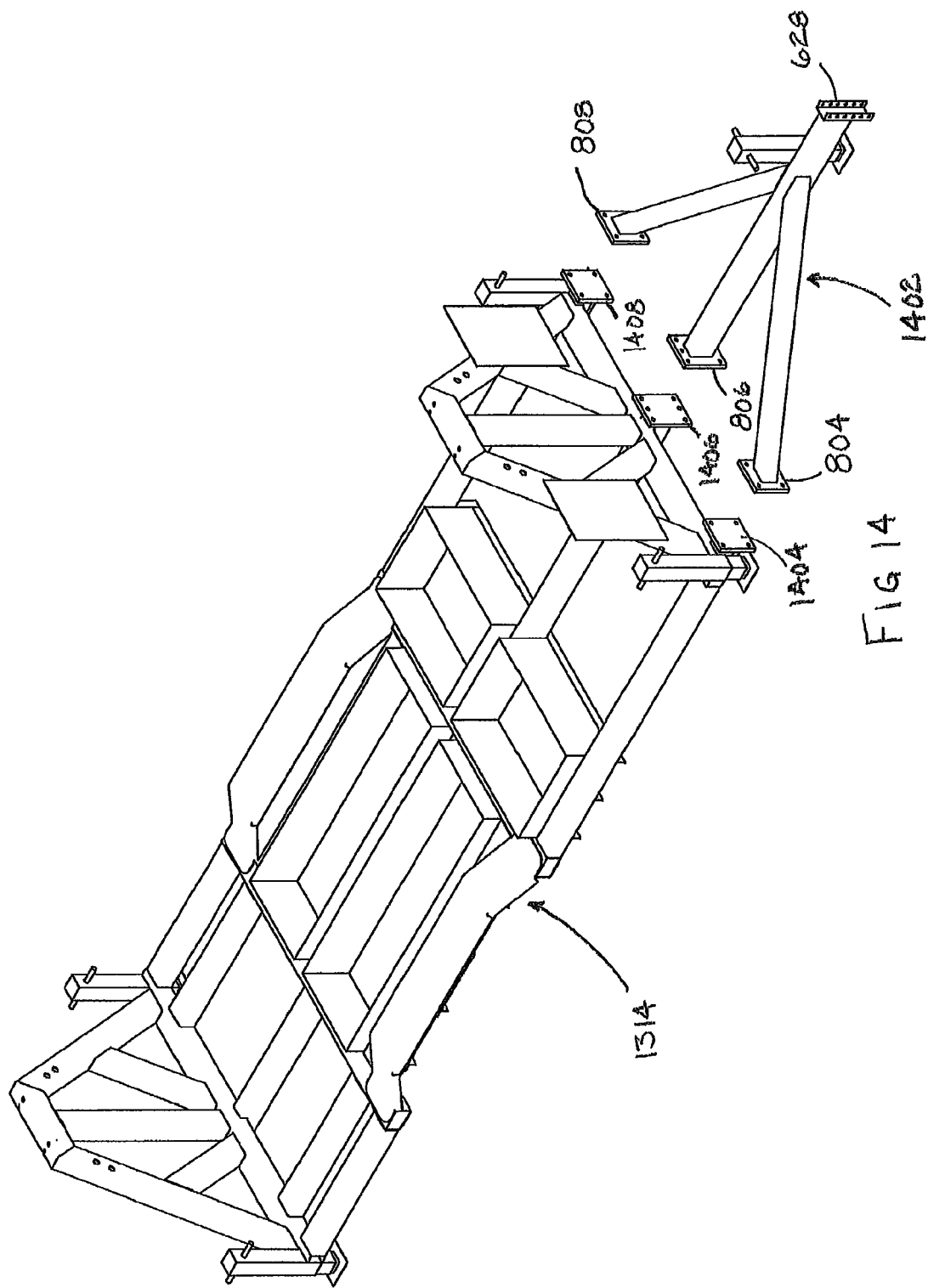
FIG. 14 is a top perspective view of the rocker frame with opposing upright bearing frames with the hitch assembly exploded away.

Referring to FIG. 13, a top perspective view of the rocker frame 606 with opposing upright bearing frames 1308 and 1306 is shown. The opposing upright bearing frames 1308 and 1306 have mounting holes 1310 and 1312 for the bearing housing. Compartments 1302, 1304 can be provided for electronics, electrical components and batteries. An implementation of the portable solar panel power source can include an electrical configuration and sufficient batteries to allow for a portion of the battery capacity to be utilized for present power demands and the other portion of the battery capacity to be used for power storage for future power demand. With the available battery capacity, the assembly can average an output range of about approximately 7920 kW to 8640 kW DC panel wattage as a basic configure unit. The rocker frame can have a main lengthwise frame 1314 and a hitch assembly 1402 mounted to the frame 1314 using flanges 804, 806 and 808. Referring to FIG. 14, a top perspective view of the rocker frame with opposing upright bearing frames with the hitch assembly 1402 exploded away is shown. The exploded view reveals the mating mounting flanges 1404, 1406, and 1408.

Figure 15:
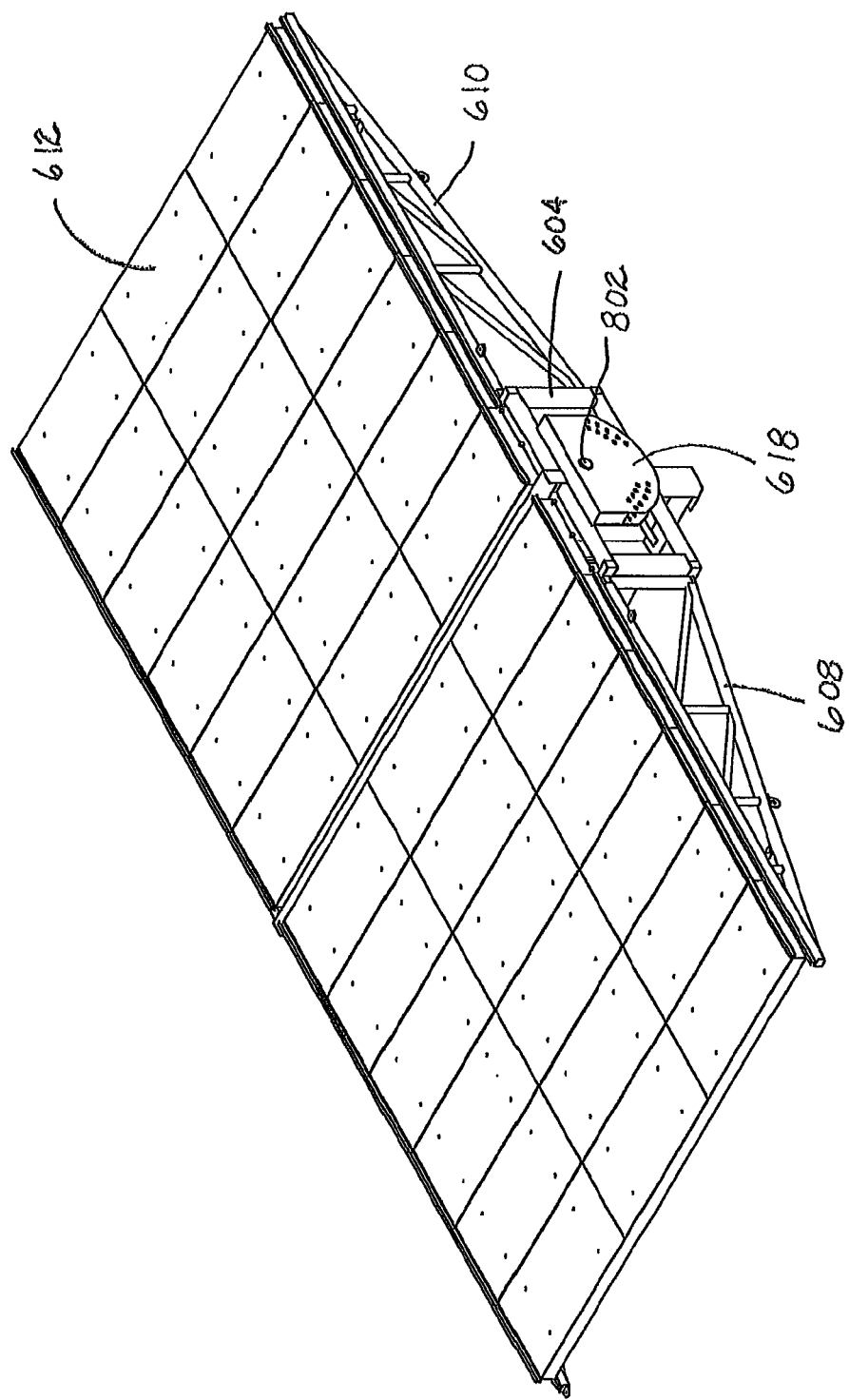
FIG. 15 is a top perspective of the view cradle frame with support trusses and panels fully deployed.
Figure 16:
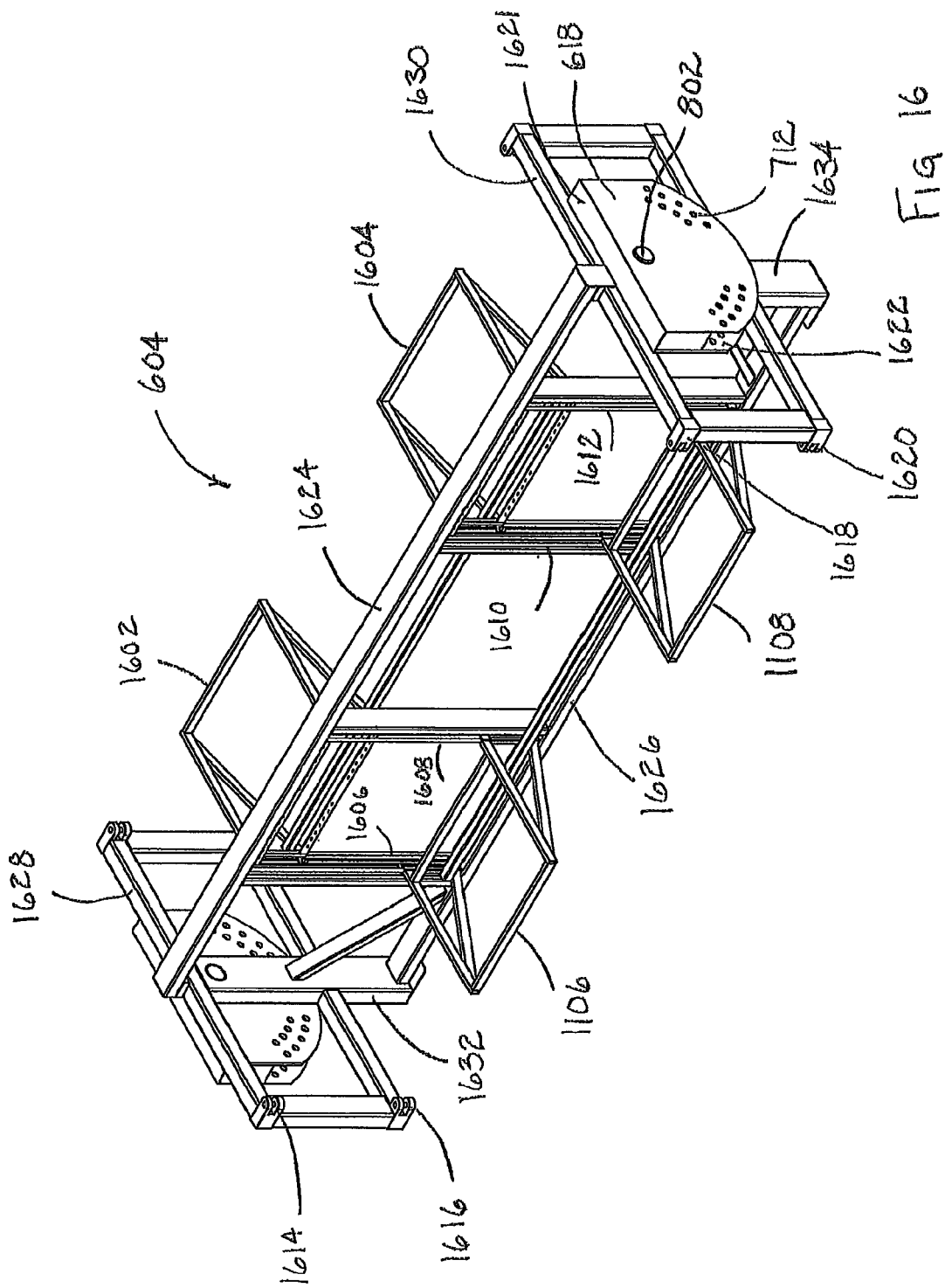
FIG. 16 is a top perspective view of the cradle frame with elevation racks.
Figure 17:
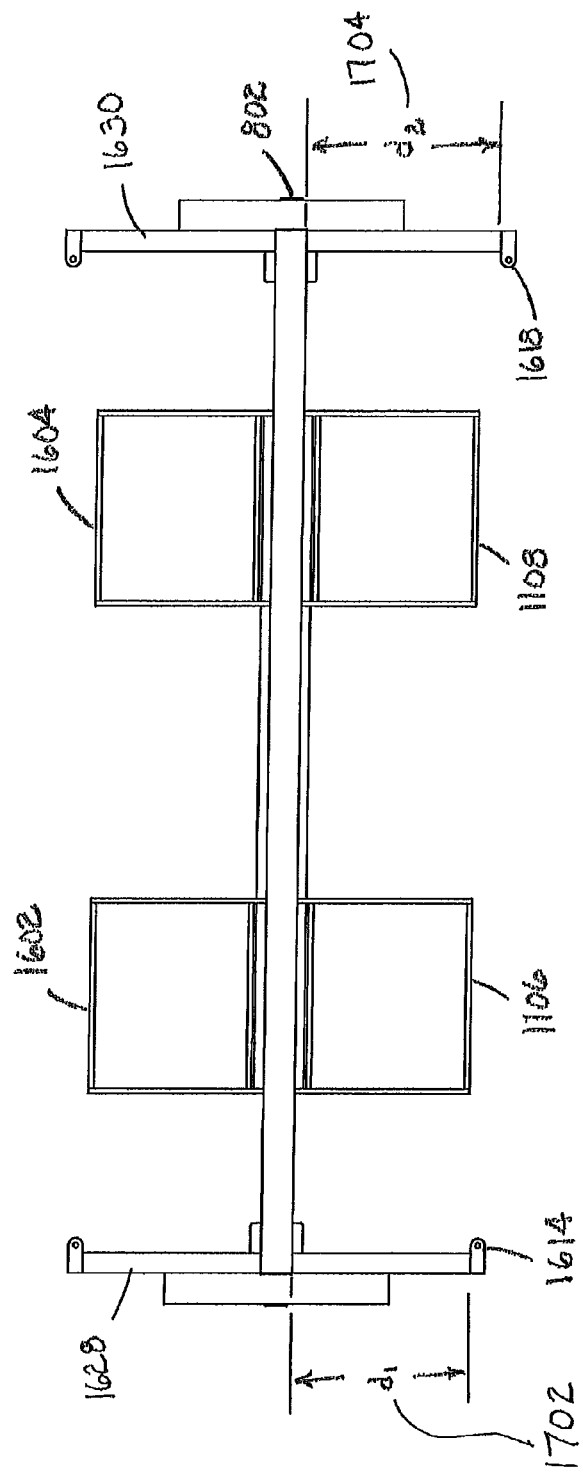
FIG. 17 is a top plan view of the cradle frame with elevation racks.

Referring to FIG. 15, a top perspective of the view cradle frame 604 with support trusses 608 and 610 and panel frames 612 fully deployed is shown. Referring to FIG. 16, a top perspective view of the cradle frame with elevation racks is shown. The elevation racks 1106 and 1108 are shown lowered to the lowest vertical elevation and the elevation racks 1602 and 1604 are shown elevated to their upper most position. The elevation racks travel vertically along elevation tracks 1606, 1608, 1610 and 1612. Various elevator rack designs can be used to perform this function, for example, the elevator rack design described in U.S. Pat. Nos. 5,626,206; 6,035,973; 6,044,932; 6,346,330; 6,899,347 and 7,481,440. The cradle frame 604 includes upper and lower central longitudinal keel members 1624 and 1626 respectively. The cradle assembly 604 can also include opposing truss supports 1628 and 1630. The opposing truss supports have upper and lower truss pivots 1614, 1618 and 1616, 1620 respectively. The saddle plate assembly 1621 includes a front adjustment plate 618 and an inner adjustment plate 1622. The saddle plate assembly is mounted to an upright support member 1634. The saddle plate assembly can simply be referred to as a positioning plate or an adjustment plate. An opposing support member 1632 is also provided. FIG. 17 provides a top plan view. The truss pivot 1618 is at a distant $d_2$ 1704 from the central keel that is greater than the distance $d_1$ 1702 from the central keel such that the trusses will stow properly.

Figure 18:
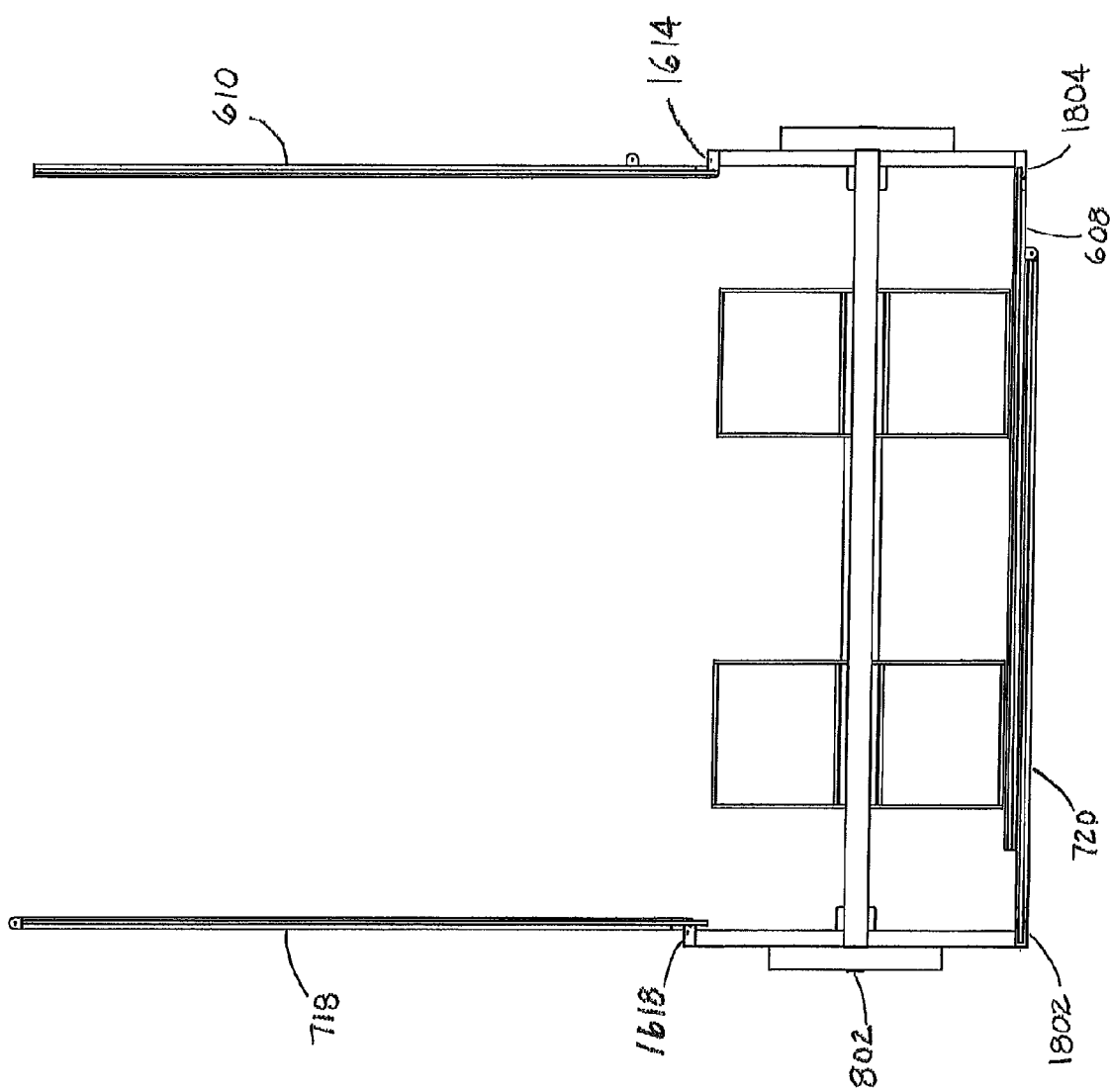
FIG. 18 is a top plan view of the cradle frame with elevation racks and a pair of trusses deployed.
Figure 19:
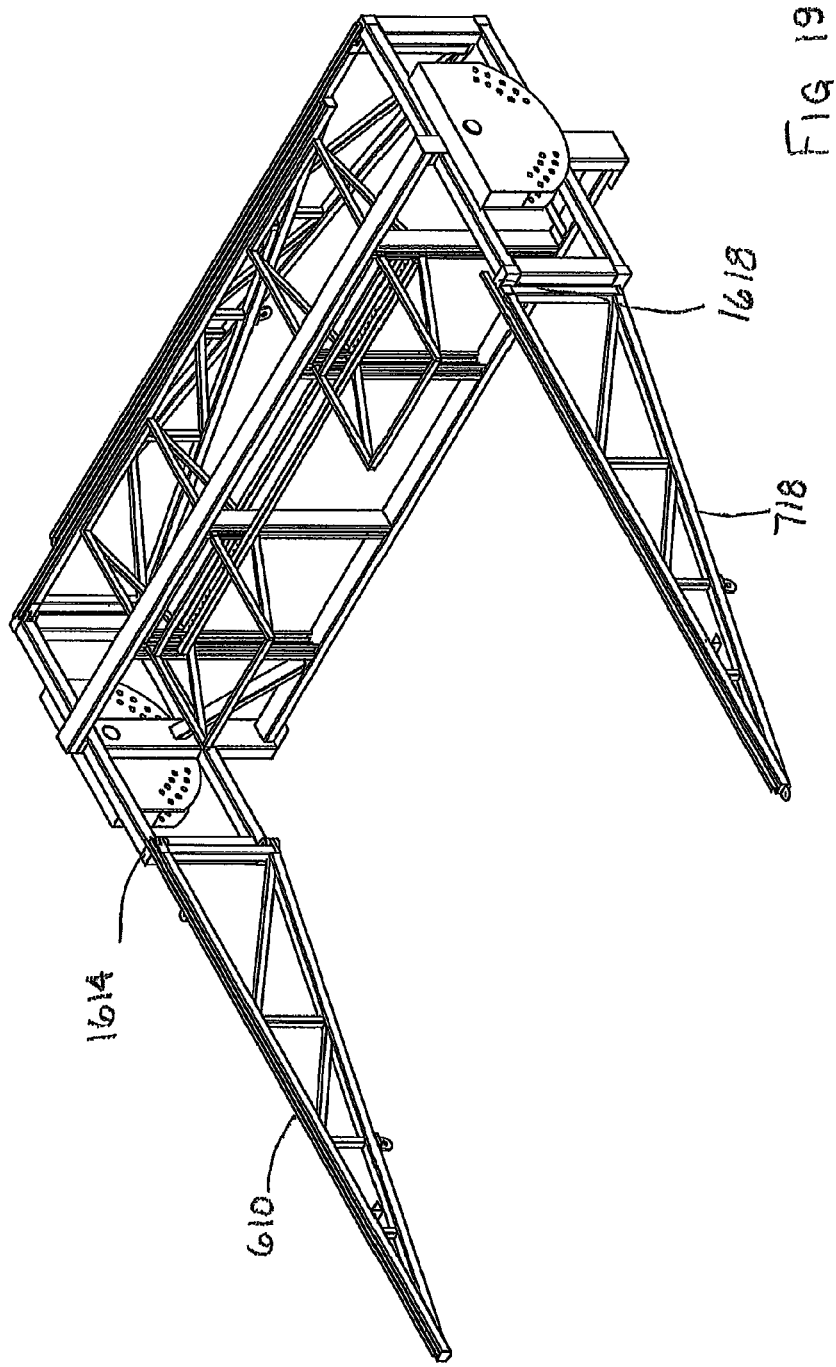
FIG. 19 is a top perspective view of the cradle frame with elevation racks and a pair of trusses deployed.

FIGS. 18-19 illustrate deploying trusses 610 and 718 and stowing trusses 720 and 608. Again, the truss pivot 1802 extends a greater distance from the central keel than does the truss pivot 1804 such that the trusses 608 and 720 can properly stow.

Figure 20:
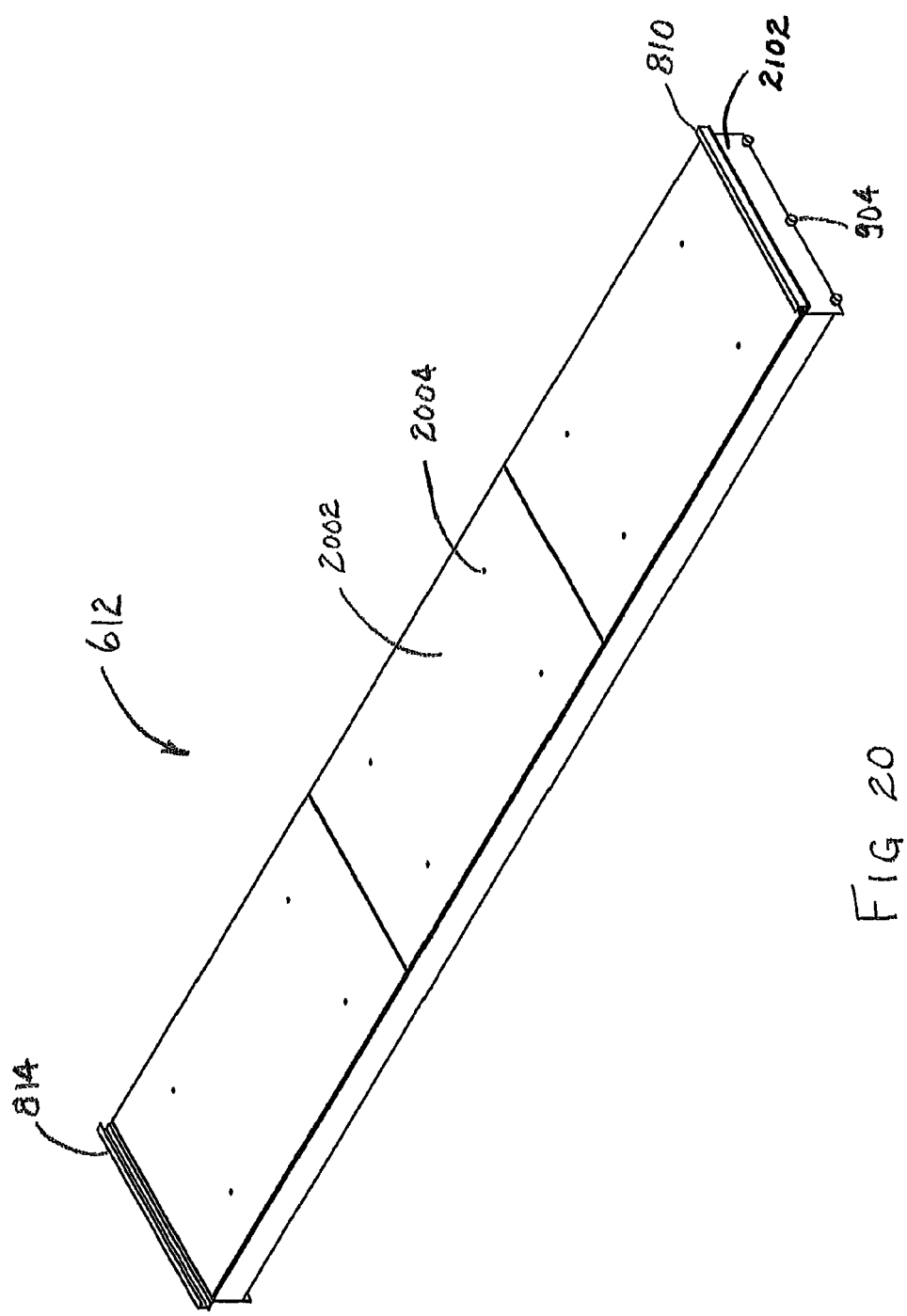
FIG. 20 is a top perspective view of a panel.
Figure 21:
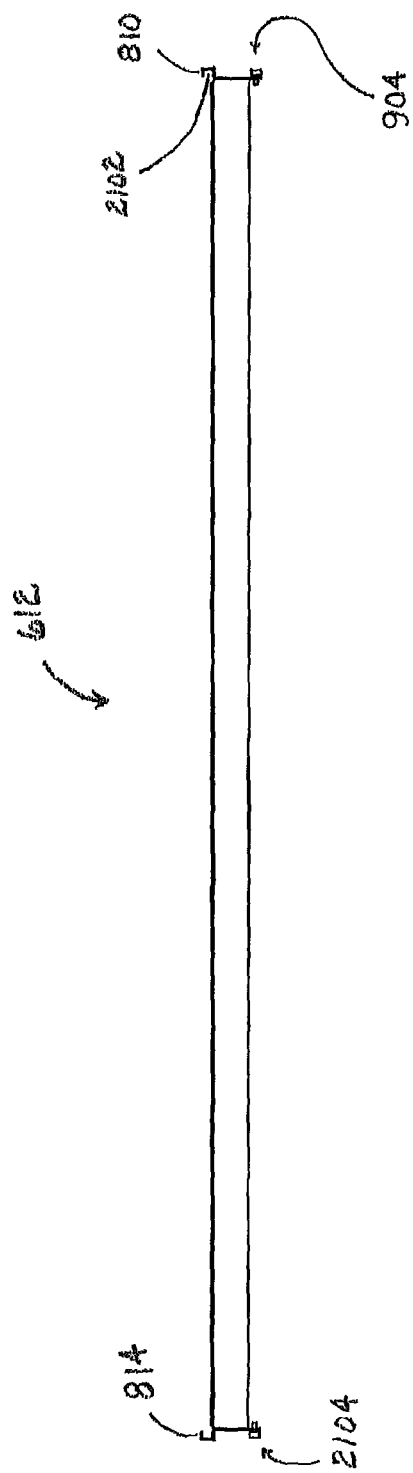
FIG. 21 is a side plan view of a panel.
Figure 22:
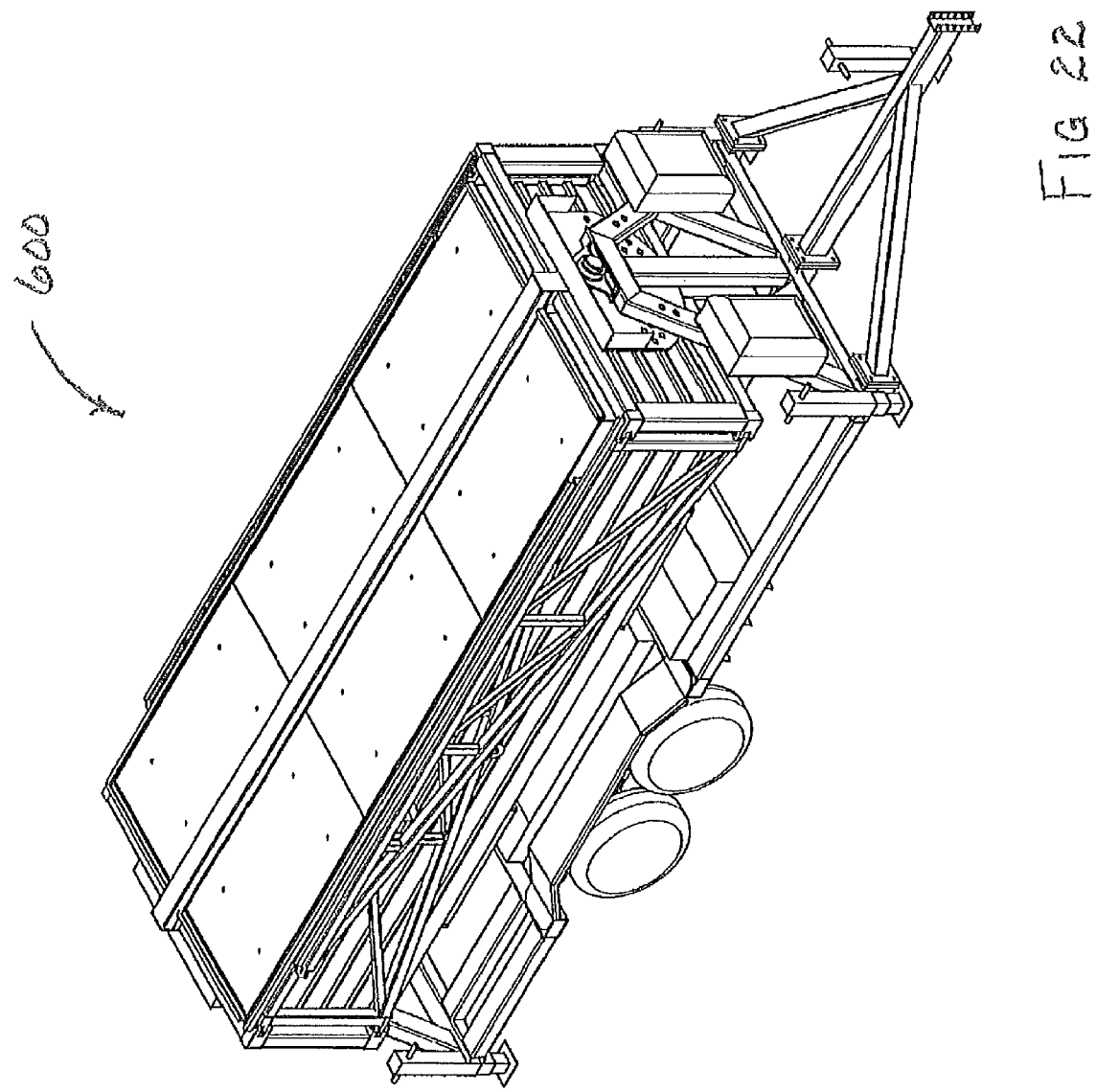
FIG. 22 is a top perspective view of the portable solar panel power source with the panels fully stowed.
Figure 23:
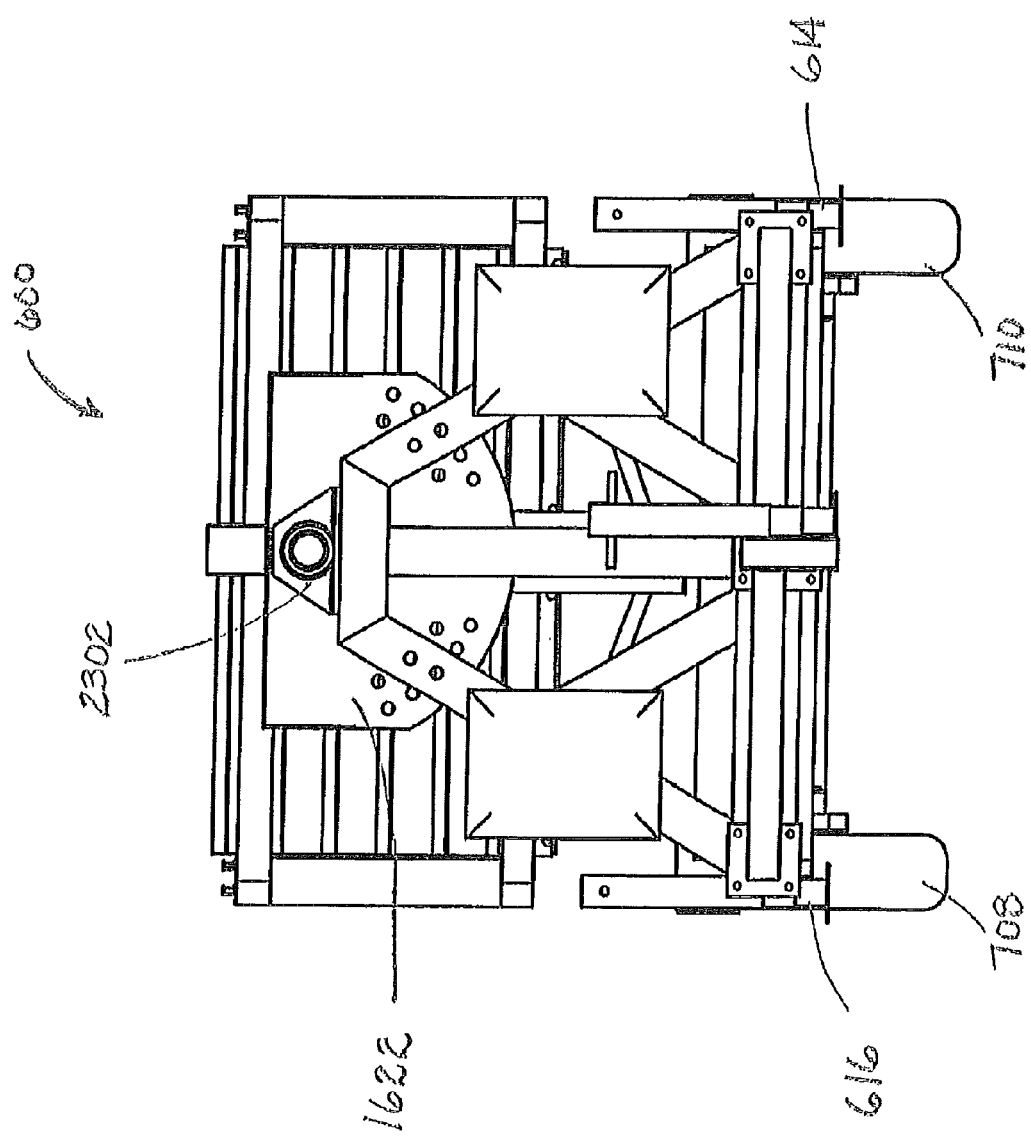
FIG. 23 is a front elevation view of the portable solar panel power source with the panels fully stowed and the front adjustment plate removed exposing the bearing.

Referring to FIG. 20, a top perspective view of a panel frames 612 is shown. The panel frame structures can be manufactured out of lightweight composite material. Adhesives can be used that are conducive for bonding composite materials to metal. The panel can have a mounting surface 2002 for mounting a solar panel using mounting holes 2004 to attach to the solar panels. The panel assemblies can have panel roller tracks 810 and 814 extending along and mounted to upper end edges of opposing ends of the panel assembly. The panel roller track can be fabricated out of metal and attached to an end plate 2102, which can also be fabricated out of metal. The panel frame body having surface 2002 for mounting the solar panel can be fabricated out of a lightweight composite material. The roller tracks are adapted to receive the rollers 904 that are positioned at a lower edge of the end of an adjacent panel when being stowed. The side plan view of FIG. 21 reveals the other opposing rollers 2104 on the opposing distal end with respect to rollers 904. FIG. 22 illustrates the portable solar panel power source 600 with its panels and trusses fully stowed and jack retracted. The hitch assembly can also be removed for shipment purposes. FIG. 23 provides a front illustration with the front adjustment panel removed revealing the bearing assembly. The positioning plate (adjustment locking plate) is mounted to cradle assembly 604. There is a horizontal bearing shaft at pivot 802 mounted to the cradle assembly between front and back positioning plates. The shaft rests within the bearing assembly 2302. In the stowed position, with the trailer hitch removed, the entire assembly can fit for example in a standard shipping container used by the Department Of Defense and the military.

An implementation of a portable power station assembly as described herein includes a rocker frame 606 having spaced apart opposing vertically upright bearing frames 1306 and 1308 extending from a base portion 1314 of the rocker frame at opposing distal ends of the base portion of the rocker frame, where the opposing vertically upright bearing frames each have respective opposing pivot bearing members 2302. A cradle frame 604 can extend between and can be pivotally attached to the opposing pivot bearing members having two pair of truss support members 608 and 720, and 610 and 718 each hingedly attached to the cradle frame to swing inward toward for stowing and outward away from for deploying the cradle frame, and where each of the pair of truss support members are attached on opposing sides of the cradle frame and each truss within each pair is attached on opposing distal ends where each of said truss supports include a roller track 812 and 816 extending lengthwise along a top support chord of the truss support member, where distal opposing ends of said cradle frame are respectively pivotally mounted on opposing pivots. A panel assembly 612 including a panel frame can be adapted for receiving solar panels including a pair of roller sets 904 and 2104 where each roller set within the pair are rotatably attached on distal opposing ends of the panel frame and each roller set positioned to engage the roller track of one of said truss support members within the pair of truss support members such that the panel frame is operable to traverse the length of the pair of truss support members along the roller tracks of the truss support members. The cradle frame can further include a vertical elevation track 1606, 1608, 1610, 1612 having an elevation rack 1602, 1604, 1106, 1108 adapted for engaging, tracking and traversing vertically on the elevation track where the elevation rack has a pair of rack support bars extending horizontally away from the vertical elevation track and where the elevation rack vertically and incrementally lowers when the panel frame is received thereon.

The various portable solar panel assembly examples shown above illustrate various embodiments of a novel portable solar panel assembly design. A user of the present invention may choose any of the above implementations, or an equivalent thereof, depending upon the desired application. In this regard, it is recognized that various forms of the subject solar panel assembly design could be utilized without departing from the spirit and scope of the present invention.

As is evident from the foregoing description, certain aspects of the present invention are not limited by the particular details of the examples illustrated herein, and it is therefore contemplated that other modifications and applications, or equivalents thereof, will occur to those skilled in the art. It is accordingly intended that the claims shall cover all such modifications and applications that do not depart from the sprit and scope of the present invention.

Other aspects, objects and advantages of the present invention can be obtained from a study of the drawings, the disclosure and the appended claims.

What is claimed is:

1. A portable power station assembly comprising:
   a rocker frame having spaced apart opposing vertically upright bearing frames extending from a base portion of the rocker frame at opposing distal ends of the base portion of the rocker frame, where the opposing vertically upright bearing frames each have respective opposing pivot bearing members;
   a cradle frame extending between and pivotally attached to the opposing pivot bearing members having a truss support member pivotally attached to the cradle frame to swing inward toward and outward away from the cradle frame, where said truss support includes a roller track extending lengthwise along a top support chord of the truss support member, where distal opposing ends of said cradle frame are respectively pivotally mounted on opposing pivots; and
   a panel frame adapted for receiving solar panels including a roller engaging the top chord roller track of the truss support member such that the panel is operable to traverse the length of the truss support member along the top chord roller track of the truss support.

2. The assembly as recited in claim 1, where the cradle frame comprises a vertical elevation track having an elevation rack adapted for tracking and traversing vertically on the elevation track where the elevation rack has a rack support bar extending horizontally away from the vertical elevation track and an innermost panel frame mounted over the rack support bar and the innermost panel frame having a panel roller track extending lengthwise along an end edge of the panel frame and said panel roller track adapted to receive the roller of an adjacent panel frame thereby receiving the adjacent panel frame thereon and where the elevation rack vertically and incrementally lowers when the adjacent panel frame is received thereon.

3. The assembly as recited in claim 1, where the cradle frame comprises a vertical elevation track having an elevation rack adapted for tracking and traversing vertically on the elevation track where the elevation rack has a rack support bar extending horizontally away from the vertical elevation track and the rack support bar having an inner-most panel frame attached thereon and where the elevation rack vertically and incrementally lowers using a crank mechanism.

4. The assembly as recited in claim 1, where the rocker frame comprises extendable support jacks when the rocker frame is stationery and wheels and a hitch for transport.

5. The assembly as recited in claim 1, where the hitch member is detachable for stowing.

6. The assembly as recited in claim 1, where the cradle frame includes upper and lower central keels extending between opposing truss supports.

7. The assembly as recited in claim 1, where the cradle assembly is operable to pivot about the pivot bearing assembly +/−20 degrees with respect to horizontal.

8. The assembly as recited in claim 1, where the cradle assembly has an adjustment locking plate covering the pivot bearing assembly and having a plurality of positioning holes adapted for insertion of a locking pin for locking the cradle assembly at a desired angle with respect to horizontal.

9. The assembly as recited in claim 1, where the rocker frame includes an attached undercarriage assembly and a hitch assembly attached to one of said opposing distal ends for mobility of the assembly.

10. The assembly as recited in claim 1, where the rocker frame assembly includes a battery and electrical circuitry housed in compartments on the base portion and said electrical circuitry operable to electrically couple solar panels installed in the panel frame to the battery for charging the battery.

11. The assembly as recited in claim 1, where the panel frame is composed of light-weight composite material.

12. A portable power station assembly comprising:
a rocker frame having spaced apart opposing vertically upright bearing frames extending from a base portion of the rocker frame at opposing distal ends of the base portion of the rocker frame, where the opposing vertically upright bearing frames each have respective opposing pivot bearing members;
a cradle frame extending between and pivotally attached to the opposing pivot bearing members having two pair of truss support members each hingedly attached to the cradle frame to swing inward toward and outward away from the cradle frame, and where each of the pair of truss support members are attached on opposing sides of the cradle frame and each truss within each pair is attached on opposing distal ends where each of said truss supports include a roller track extending lengthwise along a top support chord of the truss support member, where distal opposing ends of said cradle frame are respectively pivotally mounted on opposing pivots; and
a panel frame adapted for receiving solar panels including a pair of roller sets where each roller set within the pair are rotatably attached on distal opposing ends of the panel frame and each roller set positioned to engage the roller track of one of said truss support members within the pair of truss support members such that the panel frame is operable to traverse the length of the pair of truss support members along the roller tracks of the truss support members.

13. The assembly as recited in claim 12, where the cradle frame comprises a vertical elevation track having an, elevation rack adapted for engaging, tracking and traversing vertically on the elevation track where the elevation rack has a pair of rack support bars extending horizontally away from the vertical elevation track and an innermost panel frame mounted over the pair of rack support bars, and said innermost panel frame having a pair of opposing panel roller tracks each extending lengthwise along opposing distal ends of the innermost panel frame and where each of said opposing panel roller tracks are adapted to receive one of a set of the rollers of an adjacent panel frame thereby receiving the adjacent panel frame thereon and where the elevation rack vertically and incrementally lowers when the adjacent panel frame is received thereon.

14. The assembly as recited in claim 12, where the cradle frame comprises a vertical elevation track having an elevation rack adapted for engaging, tracking and traversing vertically on the elevation track where the elevation rack has a pair of rack support bars extending horizontally away from the vertical elevation track and the pair of rack support bars having the inner-most panel frame attached thereon and where the elevation rack is vertically and incrementally lowered using a crank mechanism.

15. The assembly as recited in claim 12, where the cradle frame includes a central keel member and opposing laterally extending end truss members, where each of the truss support members within a pair of truss support members is hingedly attached to one of the opposing laterally extending end truss members.

16. The assembly as recited in claim 15, where one of the laterally extending end truss members laterally extends further from the central keel member than the opposing laterally extending end truss member such that the truss support members properly stow.

17. The assembly as recited in claim 12, where the cradle assembly has a locking plate covering the pivot bearing assembly and having a plurality of positioning holes adapted for insertion of a locking pin for locking the cradle assembly at a desired angle with respect to horizontal.

18. The assembly as recited in claim 12, where the rocker frame includes an attached undercarriage assembly and a hitch assembly attached to one of said opposing distal ends for mobility of the assembly.

19. The assembly as recited in claim 12, where the rocker frame assembly includes a battery and electrical circuitry housed in compartments on the base portion and said electrical circuitry operable to electrically couple solar panels installed in the panel frame to the battery for charging the battery.

20. The assembly as recited in claim 12, where the panel frame is composed of light-weight composite material.

21. The assembly as recited in claim 12, where each of the truss support members includes a bottom chord and where each bottom chord has an eyelet tab attached thereto for attaching an anchoring cable to stabilize the assembly in high wind conditions.

22. The assembly as recited in claim 11, further comprising a plurality of panel frames and solar panels.

\* \* \* \* \*